US011227942B2

(12) United States Patent
Shimizu et al.

(10) Patent No.: US 11,227,942 B2
(45) Date of Patent: Jan. 18, 2022

(54) SEMICONDUCTOR DEVICE, METHOD FOR MANUFACTURING THE SAME, POWER CIRCUIT, AND COMPUTER

(71) Applicant: Kabushiki Kaisha Toshiba, Minato-ku (JP)

(72) Inventors: Tatsuo Shimizu, Shinagawa (JP); Masahiko Kuraguchi, Yokohama (JP); Toshiya Yonehara, Kawasaki (JP); Akira Mukai, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/111,952

(22) Filed: Aug. 24, 2018

(65) Prior Publication Data

US 2019/0280112 A1  Sep. 12, 2019

(30) Foreign Application Priority Data

Mar. 6, 2018 (JP) .............................. JP2018-039276

(51) Int. Cl.
*H01L 29/00* (2006.01)
*H01L 29/778* (2006.01)
(Continued)

(52) U.S. Cl.
CPC ...... *H01L 29/7786* (2013.01); *H01L 21/2233* (2013.01); *H01L 21/2236* (2013.01); *H01L 21/3065* (2013.01); *H01L 29/2003* (2013.01); *H01L 29/205* (2013.01); *H01L 29/207* (2013.01); *H01L 29/4236* (2013.01); *H01L 29/513* (2013.01); *H01L 29/66462* (2013.01)

(58) Field of Classification Search
CPC ............ H01L 29/7786; H01L 21/2233; H01L 21/2236
See application file for complete search history.

(56) References Cited

U.S. PATENT DOCUMENTS 9,330,905 B2      5/2016  Onizawa
2005/0087753 A1*  4/2005  D'Evelyn ................. C30B 9/00
                                                              257/98

(Continued)

FOREIGN PATENT DOCUMENTS

JP      2006-253224 A    9/2006
JP      2007-294528 A   11/2007
(Continued)

OTHER PUBLICATIONS

Song, D. et al., "Normally Off AlGaN/GaN Low-Density Drain HEMT (LDD-HEMT) With Enhanced Breakdown Voltage and Reduced Current Collapse" IEEE Electron Device Letters, vol. 26, No. 3, 2007, pp. 3.

*Primary Examiner* — Mounir S Amer
*Assistant Examiner* — Alexander Belousov
(74) *Attorney, Agent, or Firm* — Oblon, McClelland, Maier & Neustadt, L.L.P.

(57) ABSTRACT

A semiconductor device according to an embodiment includes a nitride semiconductor layer; an insulating layer; a first region disposed between the nitride semiconductor layer and the insulating layer and containing at least one element of hydrogen and deuterium; and a second region disposed in the nitride semiconductor layer, adjacent to the first region, and containing fluorine.

20 Claims, 20 Drawing Sheets

(51) Int. Cl.
*H01L 29/423* (2006.01)
*H01L 29/66* (2006.01)
*H01L 29/205* (2006.01)
*H01L 21/3065* (2006.01)
*H01L 29/20* (2006.01)
*H01L 21/223* (2006.01)
*H01L 29/207* (2006.01)
*H01L 29/51* (2006.01)

(56) References Cited

U.S. PATENT DOCUMENTS

| | | | |
|---|---|---|---|
| 2007/0158785 A1* | 7/2007 | D'Evelyn | C30B 9/00 257/615 |
| 2008/0070138 A1* | 3/2008 | Yagi | G03G 5/142 430/66 |
| 2011/0089468 A1* | 4/2011 | Zhang | H01L 29/42316 257/194 |
| 2012/0146046 A1 | 6/2012 | Ohki et al. | |
| 2014/0117375 A1* | 5/2014 | Isobe | H01L 29/7783 257/76 |
| 2014/0353720 A1* | 12/2014 | Inoue | H01L 29/4236 257/192 |
| 2016/0284804 A1* | 9/2016 | Shimizu | H01L 29/1608 |
| 2017/0365671 A1 | 12/2017 | Nakano et al. | |
| 2019/0280111 A1 | 9/2019 | Shimizu et al. | |

FOREIGN PATENT DOCUMENTS

| | | |
|---|---|---|
| JP | 2009-246247 | 10/2009 |
| JP | 2011-14789 | 1/2011 |
| JP | 2012-124436 A | 6/2012 |
| JP | 2012-124438 A | 6/2012 |
| JP | 2012-124442 | 6/2012 |
| JP | 2013-214692 | 10/2013 |
| JP | 2014-241350 A | 12/2014 |
| JP | 6050018 | 12/2016 |
| JP | 2017-228571 A | 12/2017 |
| JP | 2019-153725 A | 9/2019 |

* cited by examiner

3H TERMINATION

4H TERMINATION

3H TERMINATION

4H TERMINATION

FIG.12

|  | ION (H⁺) | MOLECULE (H₂) | INTERSTITIAL (H) |
|---|---|---|---|
| FORMATION ENERGY DIFFERENCE (eV) | −2.1 | +2.6 | −1.8 |

3F TERMINATION

3H TERMINATION

SEMICONDUCTOR DEVICE, METHOD FOR MANUFACTURING THE SAME, POWER CIRCUIT, AND COMPUTER

CROSS-REFERENCE TO RELATED APPLICATION

This application is based upon and claims the benefit of priority from Japanese Patent Application No. 2018-039276, filed on Mar. 6, 2018, the entire contents of which are incorporated herein by reference.

FIELD

Embodiments described herein relate generally to a semiconductor device, a method for manufacturing the same, a power circuit, and a computer.

BACKGROUND

Semiconductor devices such as transistors and diodes are used in circuits such as switching power supply circuits and inverter circuits. These semiconductor devices are required to have a high breakdown voltage and a low on-resistance. There is a trade-off relationship determined by the element material in the relationship between the breakdown voltage and the on-resistance.

Due to advances in technology development, the low on-resistance has been implemented for semiconductor devices up to near the limit of silicon being the major semiconductor material. In order to further improve the breakdown voltage or further reduce the on-resistance, it is necessary to change the semiconductor material. By using a nitride semiconductor such as gallium nitride or aluminum gallium nitride as a semiconductor material of a semiconductor device, the trade-off relationship determined by the semiconductor material can be improved. Therefore, it is possible to drastically increase the breakdown voltage and reduce the on-resistance of the semiconductor devices.

In a transistor using the nitride semiconductor, a surface state may exist in an interface between a nitride semiconductor layer and an insulating layer. When the surface state exists in the interface between the nitride semiconductor layer and the insulating layer, there is a problem in that deterioration of characteristics of the transistor occurs such as degradation in mobility, fluctuation in a threshold voltage, an increase in the on-resistance, and the like.

BRIEF DESCRIPTION OF THE DRAWINGS

FIG. 12 is a view for describing the function and the effect of the first embodiment;

FIGS. 14A and 143 are views for describing the function and the effect of the first embodiment;

DETAILED DESCRIPTION

Figure 1:
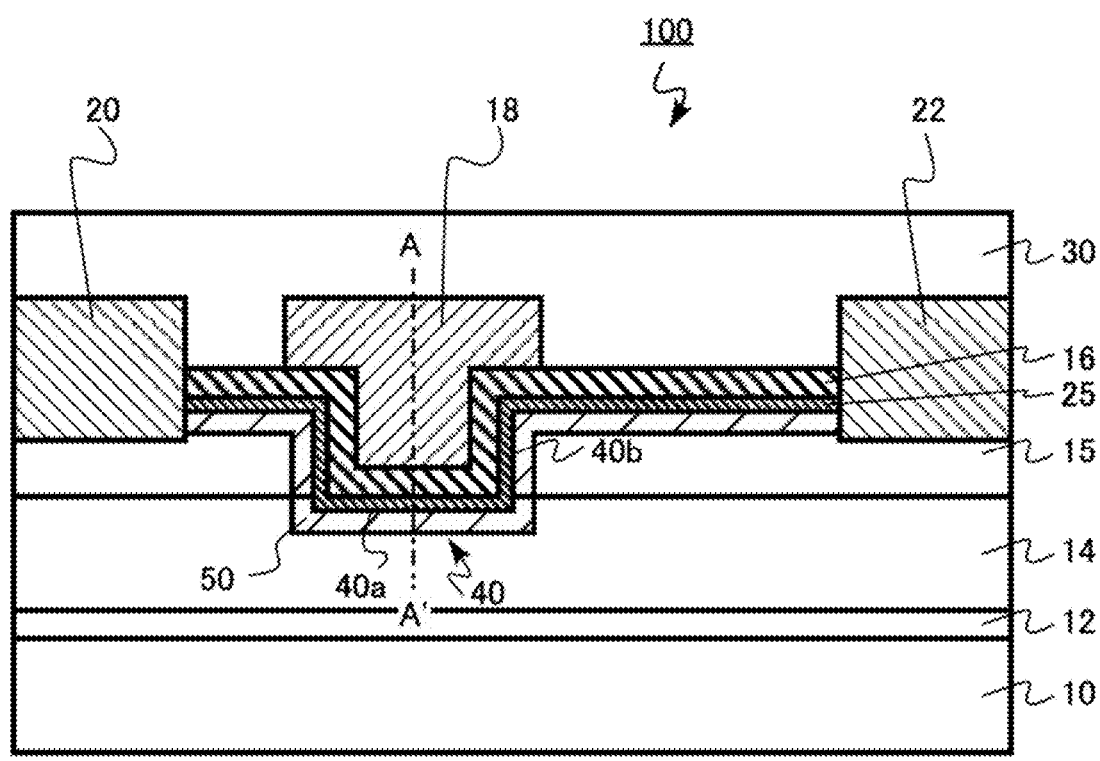
FIG. 1 is a schematic cross-sectional view of a semiconductor device according to a first embodiment.

A semiconductor device according to an embodiment includes a nitride semiconductor layer, an insulating layer, a first region disposed between the nitride semiconductor layer and the insulating layer and containing at least one element of hydrogen and deuterium, and a second region located in the nitride semiconductor layer, adjacent to the first region, and containing fluorine.

Hereinafter, embodiments of the present disclosure will be described with reference to the drawings. Further, in the following description, the same or similar members are denoted by the same reference numerals, and a description of the member once described may be omitted.

In the present specification, the "nitride semiconductor layer" includes a "GaN-based semiconductor". The "GaN-based semiconductor" generally refers a semiconductor containing gallium nitride (GaN), aluminum nitride (AlN), indium nitride (InN), and an intermediate composition thereof.

In the present specification, "undoped" means that an impurity concentration is $1\times10^{15}$ cm$^{-3}$ or less.

In the present specification, in order to indicate a position relationship of the components, and the like, a top direction in the drawing is described as "above" and a bottom direction of the drawings is described as "below". In the present specification, concepts of the "above" and the "below" are not necessarily terms indicating a relationship with a direction of gravity.

First Embodiment

A semiconductor device according to the first embodiment includes a nitride semiconductor layer, an insulating layer, a first region disposed between the nitride semiconductor layer and the insulating layer and containing at least one element of hydrogen and deuterium, and a second region disposed in the nitride semiconductor layer, adjacent to the first region, and containing fluorine. In addition, the semiconductor device according to the first embodiment includes a first nitride semiconductor layer, a second nitride semiconductor layer disposed on the first nitride semiconductor layer and having a band gap larger than that of the first nitride semiconductor layer, a first electrode disposed on or above the first nitride semiconductor layer and electrically connected to the first nitride semiconductor layer, a second electrode disposed on or above the first nitride semiconductor layer and electrically connected to the first nitride semiconductor layer, a trench disposed between the first electrode and the second electrode and having a bottom surface and a side surface, the bottom surface being disposed within the first nitride semiconductor layer, a gate electrode disposed within the trench, a gate insulating layer disposed between the bottom surface and the gate electrode, and between the side surface and the gate electrode, a first region disposed between the bottom surface and the gate insulating layer and containing at least one element of hydrogen and deuterium, and a second region disposed in at least one of the first nitride semiconductor layer and the second nitride semiconductor layer, adjacent to the first region, and containing fluorine.

FIG. 1 is a schematic cross-sectional view of a semiconductor device according to a first embodiment. The semiconductor device is a high electron mobility transistor (HEMT) 100 of an MIS structure using a GaN-based semiconductor. The HEMT 100 has a gate·recess structure in which the gate electrode is provided in the trench (recess).

The HEMT 100 includes a substrate 10, a buffer layer 12, a channel layer 14 (the nitride semiconductor layer and the first nitride semiconductor layer), a barrier layer 15 (the nitride semiconductor layer and the second nitride semiconductor layer), a gate insulating layer 16 (the insulating layer), a gate electrode 18, a source electrode 20 (the first electrode), a drain electrode 22 (the second electrode), an interface region 25 (the first region), an interlayer insulating layer 30, a trench 40, and a fluorine region 50 (the second region).

The trench 40 has a bottom surface 40a and a side surface 40b. The bottom surface 40a of the trench 40 is disposed in the channel layer 14. The gate insulating layer 16 and the gate electrode 18 are formed in the trench 40. Since the bottom surface 40a of the trench 40 is disposed in the channel layer 14, two dimensional electron gas below the gate electrode 18 is dissipated. Thus, it is possible to realize a normally-off operation.

The substrate 10 is formed of, for example, silicon (Si). Besides silicon, the substrate 10 may also be formed of, for example, sapphire (Al$_2$O$_3$) or silicon carbide (SiC).

The buffer layer 12 is provided on the substrate 10. The buffer layer 12 has a function of relieving lattice mismatch between the substrate 10 and the channel layer 14. The buffer layer 12 is formed in, for example, a multilayer structure of aluminum gallium nitride (Al$_W$Ga$_{1-W}$N ($0<W\leq1$)).

The channel layer 14 is provided on the buffer layer 12. The channel layer 14 is also referred to as an electron transport layer. The channel layer 14 is, for example, undoped aluminum gallium nitride (Al$_X$Ga$_{1-X}$N ($0\leq X<1$)). More specifically, the channel layer 14 is, for example, undoped gallium nitride (GaN). A thickness of the channel layer 14 is, for example, 0.1 µm or more and 10 µm or less.

The barrier layer 15 is provided on the channel layer 14. The barrier layer 15 is also referred to as an electron supply layer. A band gap of the barrier layer 15 is larger than the band gap of the channel layer 14. The barrier layer 15 is, for example, undoped aluminum gallium nitride (Al$_Y$Ga$_{1-Y}$N ($0<Y\leq1$, $X<Y$)). More specifically, the barrier layer 15 is, for example, undoped Al$_{0.25}$Ga$_{0.75}$N. A thickness of the barrier layer 15 is, for example, 10 nm or more and 100 nm or less.

A hetero-junction interface is formed between the channel layer 14 and the barrier layer 15. A two dimensional electron gas (2DEG) is formed at the hetero-junction interface and becomes a carrier of the HEMT 100.

In addition, surfaces of the channel layer 14 and the barrier layer 15 are (0001) faces. The (0001) face is a gallium face of the GaN-based semiconductor. The outermost surfaces of the channel layer 14 and the barrier layer 15 have a structure in which gallium atoms or aluminum atoms are arranged.

The source electrode 20 is provided on or above the channel layer 14 and the barrier layer 15. The source electrode 20 is electrically connected to the channel layer 14 and the barrier layer 15. The source electrode 20 is in contact with, for example, the barrier layer 15.

The source electrode 20 is, for example, a metal electrode. The source electrode 20 is, for example, a stacked structure of titanium (Ti) and aluminum (Al). It is desirable that the source electrode 20 and the barrier layer 15 are in ohmic contact with each other.

The drain electrode 22 is provided on or above the channel layer 14 and the barrier layer 15. The drain electrode 22 is electrically connected to the channel layer 14 and the barrier layer 15. The drain electrode 22 is in contact with, for example, the barrier layer 15.

The drain electrode 22 is, for example, a metal electrode. The drain electrode 22 is, for example, a stacked structure of titanium (Ti) and aluminum (Al). It is desirable that the drain electrode 22 and the barrier layer 15 are in ohmic contact with each other.

A distance between the source electrode 20 and the drain electrode 22 is, for example, 5 µm or more and 30 µm or less.

Further, it is possible for the source electrode 20 and the drain electrode 22 to be in contact with the channel layer 14.

The trench 40 is provided between the source electrode 20 and the drain electrode 22. The trench 40 has a bottom surface 40a and a side surface 40b. The bottom surface 40a of the trench 40 is disposed in the channel layer 14. Although not shown, before forming the trench 40, a silicon nitride film or an aluminum nitride film may be formed, and the process may proceed while the silicon nitride film or the aluminum nitride film remains. In this case, on the barrier layer 15, a stacked film including the silicon nitride film or the aluminum nitride film is formed between the barrier layer 15 and the gate insulating layer 16. From the viewpoint of protection of the surface of the barrier layer 15, it is preferable to sandwich a silicon nitride film or an aluminum nitride film between the barrier layer 15 and the gate insulating layer 16.

At least a portion of the gate electrode 18 is formed in the trench 40. The gate electrode 18 is provided on the barrier layer 15. The gate electrode 18 is provided between the source electrode 20 and the drain electrode 22.

The gate electrode 18 is, for example, a polycrystalline silicon containing conductive impurities. In addition, the gate electrode 18 is, for example, a metal. The gate electrode 18 is, for example, titanium nitride (TiN).

At least a portion of the gate insulating layer 16 is formed in the trench 40. The gate insulating layer 16 is disposed between the channel layer 14 and the gate electrode 18. The gate insulating layer 16 is disposed between the bottom surface 40a of the trench 40 and the gate electrode 18, and between the side surface 40b of the trench 40 and the gate electrode 18.

The gate insulating layer 16 is also formed on the barrier layer 15 between the gate electrode 18 and the drain electrode 22. The gate insulating layer 16 is also formed on the barrier layer 15 between the gate electrode 18 and the source electrode 20.

The gate insulating layer 16 is formed of, for example, an oxide or an oxynitride. The gate insulating layer 16 is formed of, for example, silicon oxide, aluminum oxide, silicon oxynitride, or aluminum oxynitride. The gate insulating layer 16 may include, for example, a nitride. The nitride is formed of, for example, silicon nitride or aluminum nitride. The gate insulating layer 16 is typically in an amorphous state. In particular, however, the aluminum nitride includes a case in which a portion of the aluminum nitride shows crystallinity at the interface with the channel layer 14. In addition, a portion of the gate insulating layer 16 contacting the channel layer 14 and a portion of the gate insulating layer 16 contacting the barrier layer 15 may be different from each other.

A thickness of the gate insulating layer 16 is, for example, 20 nm or more and 100 nm or less. An equivalent silicon oxide film thickness (equivalent oxide thickness; EOT) of the gate insulating layer 16 is, for example, 20 nm or more and 40 nm or less.

The interface region 25 is provided between the channel layer 14 and the gate insulating layer 16, and between the barrier layer 15 and the gate insulating layer 16. The interface region 25 is provided between the bottom surface 40a and the side surface 40b of the trench 40 and the gate insulating layer 16. The interface region 25 is provided between the barrier layer 15 between the gate electrode 18 and the drain electrode 22 and the gate insulating layer 16. In addition, the interface region 25 is provided between the barrier layer 15 between the gate electrode 18 and the source electrode 20 and the gate insulating layer 16.

The interface region 25 includes hydrogen or deuterium. In the interface region 25, a dangling bond of a gallium atom or an aluminum atom is terminated by a hydrogen atom or a deuterium atom. Hereinafter, the case of termination by a hydrogen atom will be described as an example.

The fluorine region 50 is disposed in the channel layer 14 and the barrier layer 15 around the trench 40. The fluorine region 50 is adjacent to the bottom surface 40a of the trench 40 in the channel layer 14. The fluorine region 50 is disposed in vicinity of the bottom surface 40a of the trench 40 in the channel layer 14. The fluorine region 50 is in contact with the bottom surface 40a of the trench 40. The fluorine region 50 is adjacent to the side surface 40b of the trench 40 of the barrier layer 15. The fluorine region 50 is disposed in vicinity of the side surface 40b of the trench 40 of the barrier layer 15. The fluorine region 50 is in contact with the side surface 40b of the trench 40.

The fluorine region 50 is disposed in vicinity of the surface of the barrier layer 15 between the gate electrode 18 and the drain electrode 22. The fluorine region 50 is in contact with the surface of the barrier layer 15 between the gate electrode 18 and the drain electrode 22. The fluorine region 50 is disposed in vicinity of the surface of the barrier layer 15 between the gate electrode 18 and the source electrode 20. The fluorine region 50 is in contact with the surface of the barrier layer 15 between the gate electrode 18 and the source electrode 20. It is preferable that the fluorine region 50 does not exist between the drain electrode 22 and the barrier layer 15. It is preferable that the fluorine region 50 does not exist between the source electrode 20 and the barrier layer 15. Since an amount of nitrogen deficiency VN is small in the fluorine region 50, a sheet resistance may increase.

The fluorine region 50 is adjacent to the interface region 25. The fluorine region 50 is disposed in the vicinity of the interface region 25. The fluorine region 50 is in contact with the interface region 25. The fluorine region 50 is a nitride semiconductor containing fluorine (F).

Figure 2:
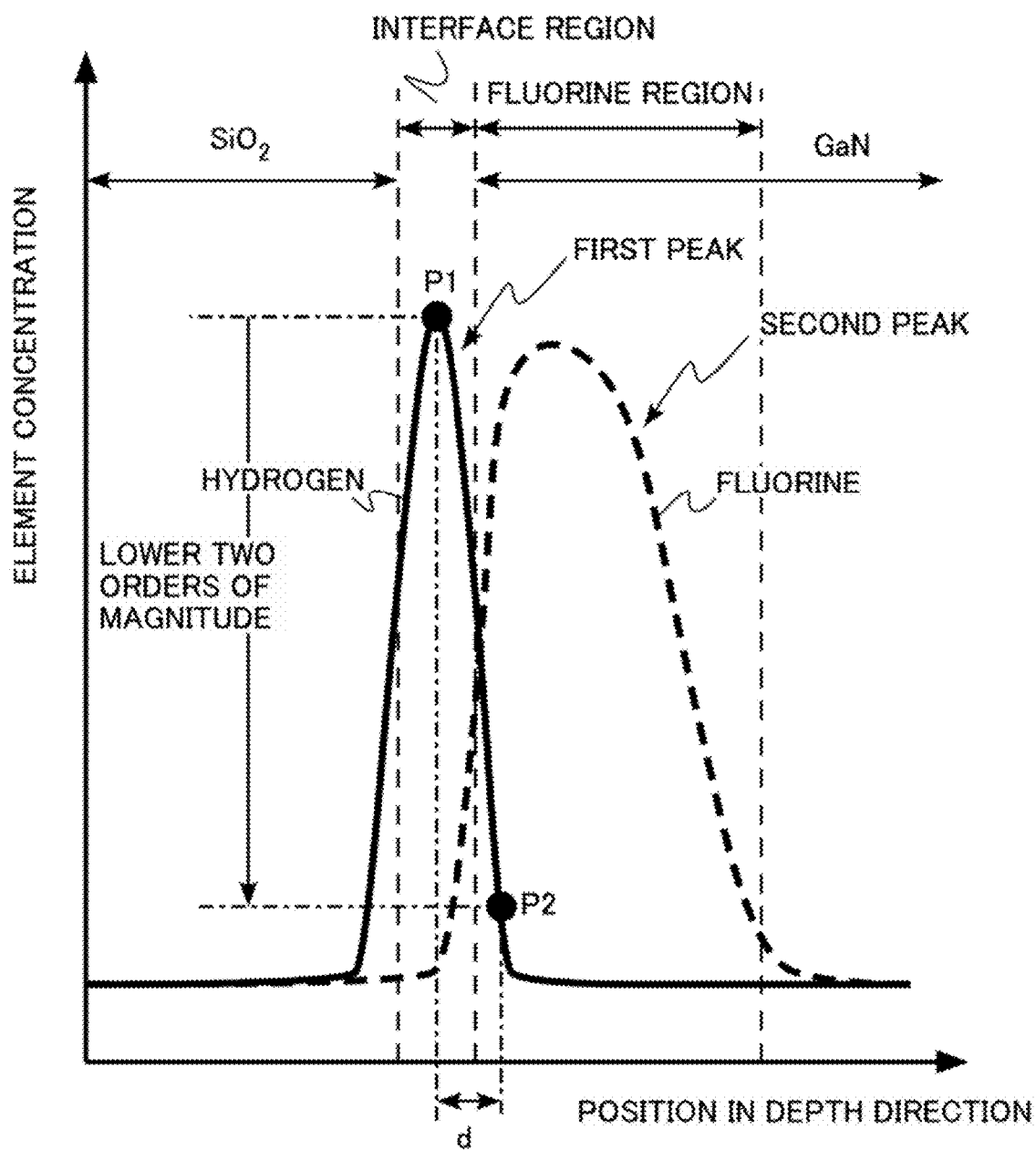
FIG. 2 is a graph showing concentration distributions of elements of the semiconductor device according to the first embodiment.

FIG. 2 is a graph showing concentration distributions of elements of the semiconductor device according to the first embodiment. FIG. 2 shows concentration distributions of elements in the gate insulating layer 16, the interface region 25, and the nitride semiconductor layer. FIG. 2 shows concentration distributions of hydrogen (H) and fluorine (F) in a depth direction along a line A-A' of FIG. 1. FIG. 2 illustrates a case in which the gate insulating layer 16 is silicon oxide ($SiO_2$) and the nitride semiconductor layer is gallium nitride (GaN).

A first peak of a hydrogen concentration distribution is within the interface region 25. A second peak of a fluorine concentration distribution is within the fluorine region 50.

The hydrogen concentration in the interface region 25 is $1 \times 10^{19}$ cm$^{-3}$ or more and $1 \times 10^{22}$ cm$^{-3}$ or less. The fluorine concentration in the fluorine region 50 is $1 \times 10^{19}$ cm$^{-3}$ or more and $1 \times 10^{22}$ cm$^{-3}$ or less.

The hydrogen concentration in the interface region 25 is represented by, for example, the maximum value of the hydrogen concentration obtained in the measurement. The fluorine concentration in the fluorine region 50 is represented by, for example, the maximum value of the fluorine concentration obtained in the measurement.

A full width at half maximum of the first peak is, for example, 2 nm or less. A full width at half maximum of the second peak is, for example, 10 nm or less.

In addition, a distance ("d" in FIG. 2) between a first position P1 at which a concentration of the hydrogen has the maximum value and a second position P2 present on the side of the nitride semiconductor layer with respect to the first position P1 and having the concentration of the hydrogen which is two orders of magnitude lower than the maximum value is 1 nm or less.

The fluorine region 50 has three fluorine atoms present at a position of nitrogen atom of a crystal lattice of the nitride semiconductor. The fluorine region 50 has a first fluorine atom bonded to a first gallium atom and a second gallium atom, a second fluorine atom bonded to the first gallium atom and a third gallium atom, and a third fluorine atom bonded to the first gallium atom and a fourth gallium atom.

The semiconductor layer, the type of elements of the semiconductor region, and the element concentration may be measured, for example, by Secondary Ion Mass Spectrometry (SIMS) and Energy Dispersive X-ray Spectroscopy (EDX). It is also possible to determine a relative level of the element concentration from a level of a carrier concentration obtained by Scanning Capacitance Microscopy (SCM), for example. In addition, it is possible to obtain distances such as a depth, a thickness, a width, a spacing, and the like of the impurity region by SIMS, for example. In addition, it is also possible to obtain the distances such as the depth, the thickness, the width, the spacing, and the like of the impurity region from a comparison image between an SCM image and an atom probe image, for example.

In addition, it is possible to determine a bonded state of the atoms in the fluorine region 50 by XPS (X-ray Photoelectron Spectroscopy), for example, In addition, it is possible to determine a bonded state or a distribution state of the atoms in the fluorine region 50 by XAFS (X-ray Absorption Fine Structure), for example.

Next, one example of a method for manufacturing a semiconductor device according to a first embodiment will be described. FIGS. 3 to 9 are schematic cross-sectional views showing a method for manufacturing a semiconductor device according to a first embodiment.

In the method for manufacturing the semiconductor device according to the first embodiment, a trench having a bottom surface and a side surface is formed in the nitride semiconductor layer, and after the trench is formed, a first plasma treatment is performed in an atmosphere containing nitrogen trifluoride, a gate insulating layer is formed in the trench, a heat treatment is performed in an atmosphere containing hydrogen, and a gate electrode is formed on the gate insulating layer.

First, a substrate 10, for example, a silicon substrate is prepared. Next, for example, a multilayer structure of aluminum gallium nitride, which becomes a buffer layer 12, is formed by epitaxial growth on the silicon substrate. For example, the buffer layer 12 is grown by metal organic chemical vapor deposition (MOCVD) method.

Figure 3:
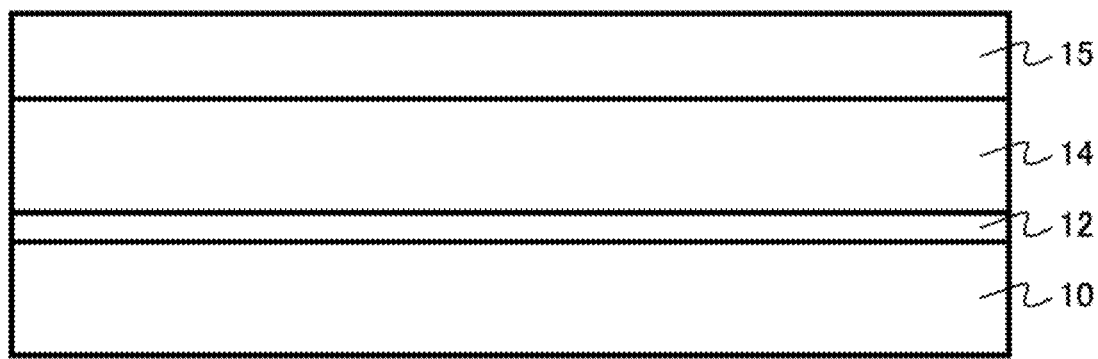
FIG. 3 is a schematic cross-sectional view showing a method for manufacturing a semiconductor device according to a first embodiment.

Next, undoped gallium nitride, which becomes the channel layer 14 (the first nitride semiconductor layer) and undoped aluminum gallium nitride, which becomes the barrier layer 15 (the second nitride semiconductor layer) are formed by epitaxial growth on the buffer layer 12 (FIG. 3). For example, the channel layer 14 and the barrier layer 15 are grown by MOCVD method.

Figure 4:
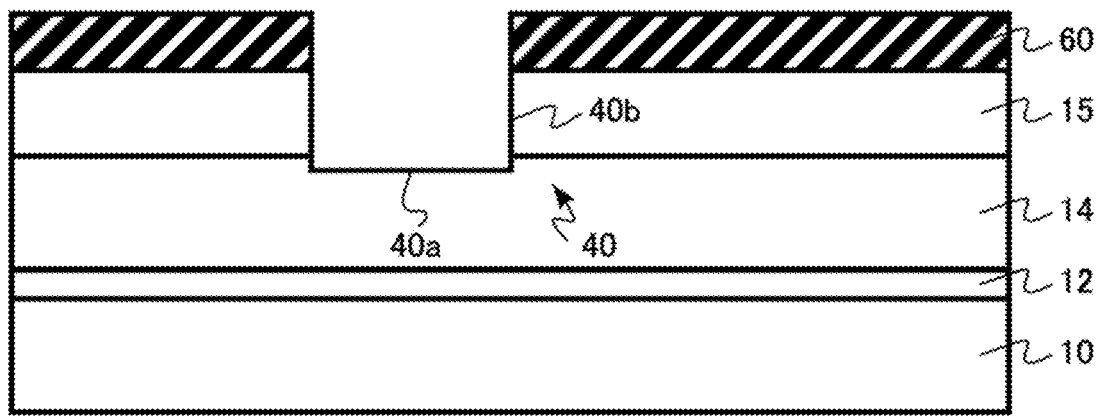
FIG. 4 is a schematic cross-sectional view showing a method for manufacturing a semiconductor device according to a first embodiment.

Next, a trench 40 is formed in the barrier layer 15 and the channel layer 14 by using a mask material 60 as a mask (FIG. 4). The trench 40 penetrates through the barrier layer 15 and reaches the channel layer 14. The trench 40 has a bottom surface 40a and a side surface 40b.

The mask material 60 is, for example, a silicon nitride film. The trench 40 is formed, for example, by a reactive ion etching method (RIE method). The trench 40 is etched using, for example, gas containing chlorine.

Figure 5:
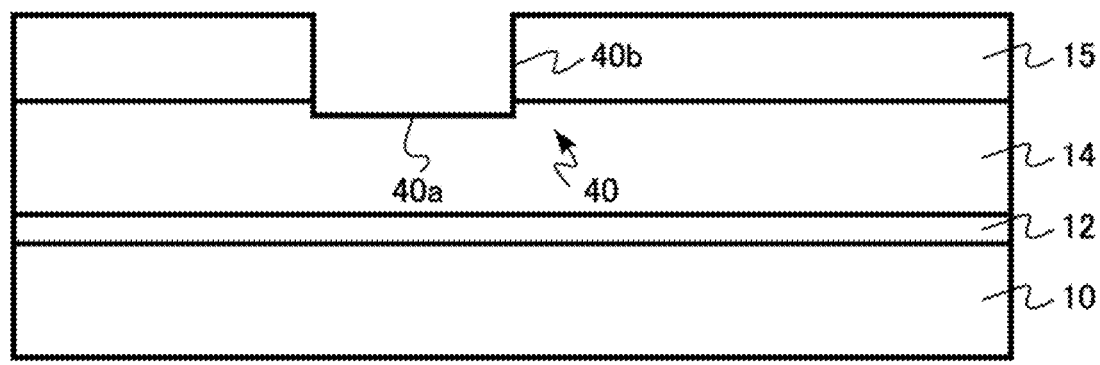
FIG. 5 is a schematic cross-sectional view showing a method for manufacturing a semiconductor device according to a first embodiment.

Next, the mask material 60 is removed (FIG. 5). The removal of the mask material is performed using, for example, wet etching.

Figure 6:
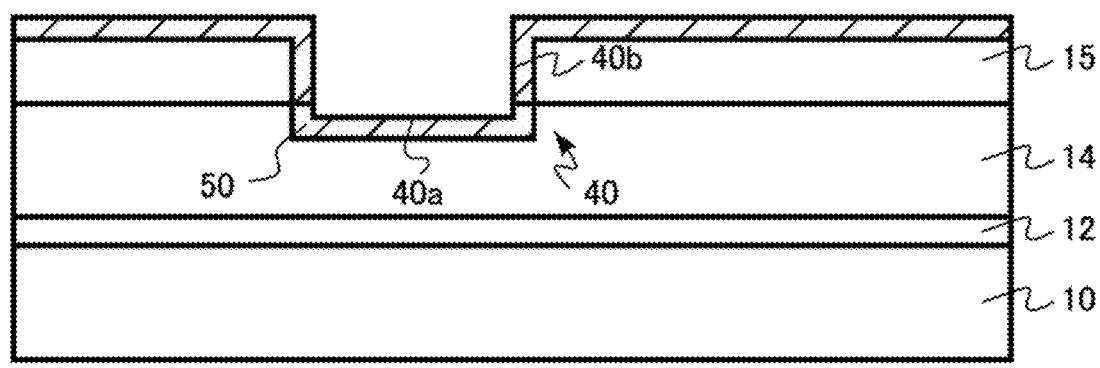
FIG. 6 is a schematic cross-sectional view showing a method for manufacturing a semiconductor device according to a first embodiment.

Next, a first plasma treatment is performed in an atmosphere containing nitrogen trifluoride ($NF_3$) (FIG. 6). A fluorine region 50 is formed by the first plasma treatment. The fluorine region 50 is formed around the trench 40 and on a surface of the barrier layer 15.

Figure 7:
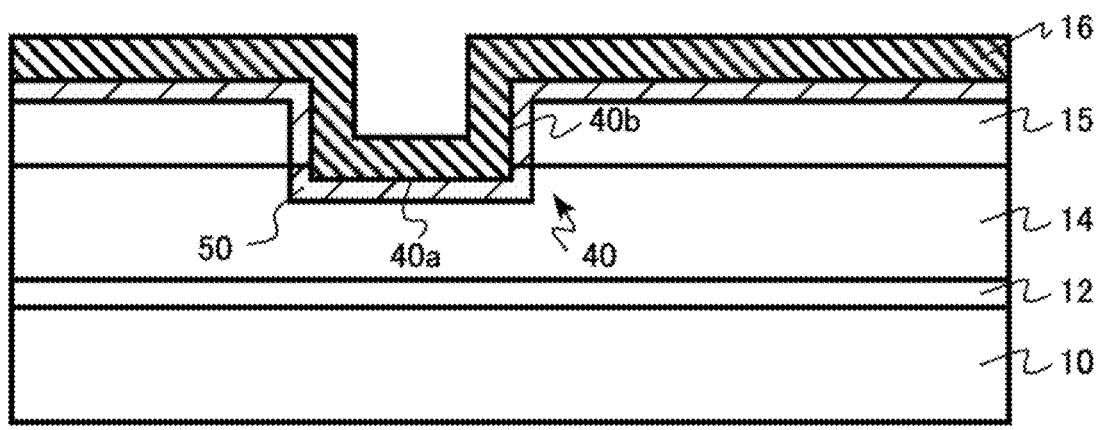
FIG. 7 is a schematic cross-sectional view showing a method for manufacturing a semiconductor device according to a first embodiment.

Next, a gate insulating layer 16 is formed on the channel layer 14 and the barrier layer 15 (FIG. 7). The gate insulating layer 16 is formed of an oxide or an oxynitride. The gate insulating layer 16 is formed of, for example, silicon oxide, aluminum oxide, silicon oxynitride, or aluminum oxynitride. However, in order to prevent nitrogen leakage from the channel layer 14 and the barrier layer 15, it is preferable to insert an amorphous $Si_3N_4$ film having a thickness of 0.5 nm or more and 5 nm or less, or a crystallized AlN film having a thickness of 0.5 nm or more and 5 nm or less into an interface between the channel layer 14 the gate insulating layer 16 and the barrier layer 15 and the gate insulating layer 16. The amorphous $Si_3N_4$ film or the crystallized AlN film having the thickness less than 0.5 nm is difficult to serve as a nitrogen supply source. The amorphous $Si_3N_4$ film or the crystallized AlN film having the thickness of 5 nm or more has a high possibility of trap.

The gate insulating layer 16 is formed by, for example, a chemical vapor deposition (CVD) method.

Next, a heat treatment is performed at 800° C. or more and 1000° C. or less. The gate insulating layer 16 is densified by the heat treatment.

Figure 8:
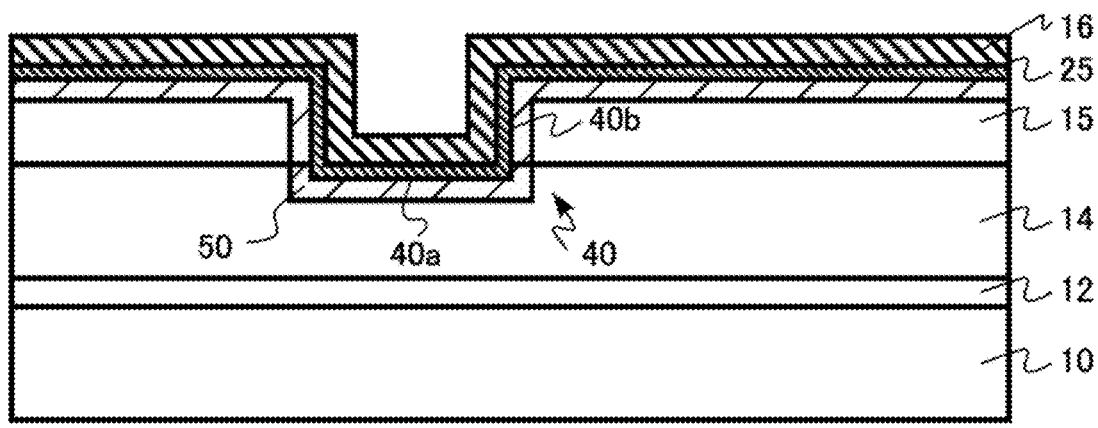
FIG. 8 is a schematic cross-sectional view showing a method for manufacturing a semiconductor device according to a first embodiment.

Next, heat treatment is performed in an atmosphere containing hydrogen (FIG. 8). For example, the heat treatment is performed at a temperature of 350° C. or more and 500° C. or less in a mixed atmosphere of hydrogen gas ($H_2$ gas) and nitrogen gas ($N_2$ gas). By the above-mentioned heat treatment, an interface region 25 containing hydrogen is formed. It should be noted that a fluorine region 50 is formed prior to the heat treatment in the atmosphere containing hydrogen. As shown later (FIG. 15), when the heat treatment is performed in an atmosphere containing hydrogen without forming the fluorine region 50, hydrogen enters a large amount of nitrogen deficiency, and the state of the gap appears. Since charges enter and leave this state of gap, a device operation becomes unstable.

Figure 9:
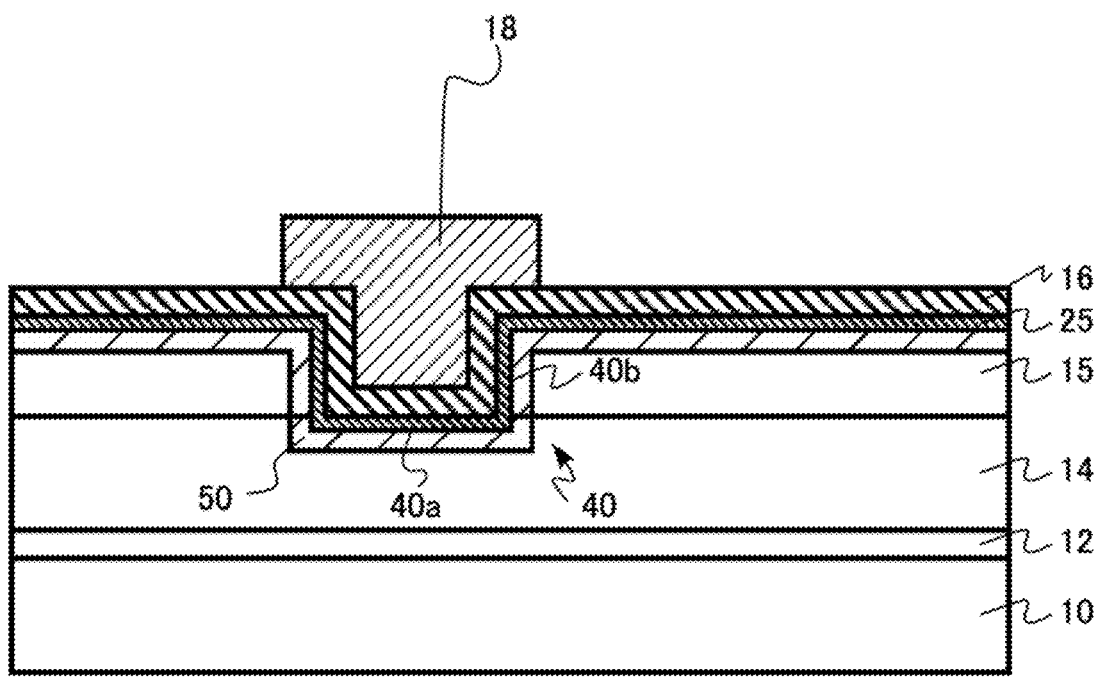
FIG. 9 is a schematic cross-sectional view showing a method for manufacturing a semiconductor device according to a first embodiment.

Next, a gate electrode 18 is formed on the gate insulating layer 16 (FIG. 9). The gate electrode 18 is, for example, a polycrystalline silicon containing a conductive impurity. In addition, the gate electrode 18 is, for example, a metal. The gate electrode 18 is, for example, titanium nitride (TiN).

The gate electrode 18 is formed by, for example, forming a conductive film by a CVD method or a sputtering method, and patterning by a lithography method and a dry etching method.

Next, a source electrode 20, a drain electrode 22, and an interlayer insulating layer 30 are formed by a known method.

By the manufacturing method described above, the HEMT 100 shown in FIG. 1 is formed.

Hereinafter, a function and an effect of the semiconductor device according to the first embodiment and the method for manufacturing the same will be described.

In a transistor using the nitride semiconductor, a surface state may exist in an interface between a nitride semiconductor layer and an insulating layer. When the surface state exists in the interface between the nitride semiconductor layer and the insulating layer, there is a problem in that deterioration of characteristics of the transistor occurs such as degradation in mobility, fluctuation in a threshold voltage, an increase in the on-resistance, and the like.

It is considered that the surface state between the nitride semiconductor layer and the insulating layer is formed by a dangling bond of atoms on the surface of the nitride semiconductor layer. In the semiconductor device according to the first embodiment, the dangling bond on the surface of the nitride semiconductor layer is terminated with a hydrogen atom. Therefore, the surface state between the nitride semiconductor layer and the insulating layer is reduced. Thus, deterioration of transistor characteristics is suppressed. This will be described in detail below.

Figure 10A:
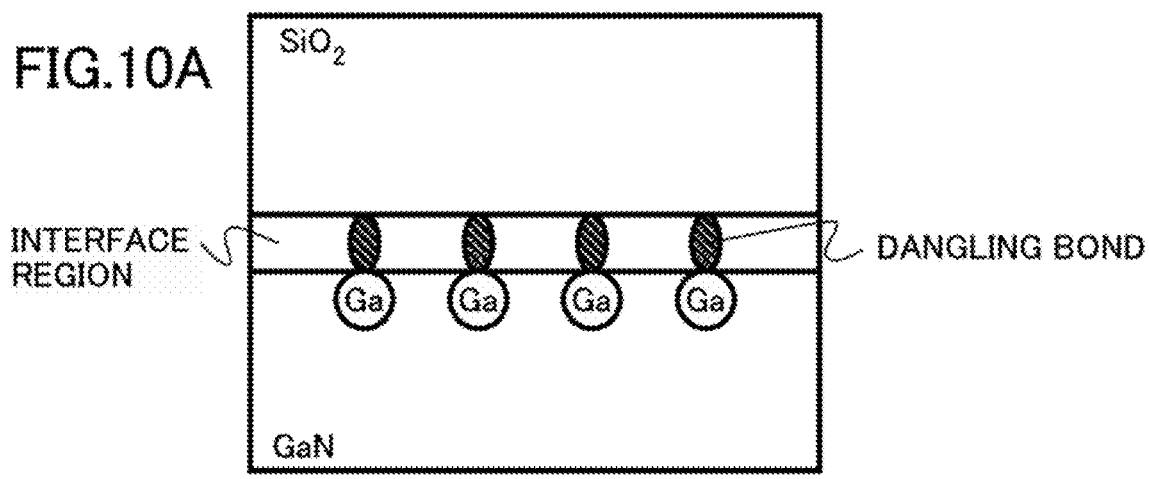
FIGS. 10A to 10C are views for describing a function and an effect of the first embodiment.
Figure 10B:
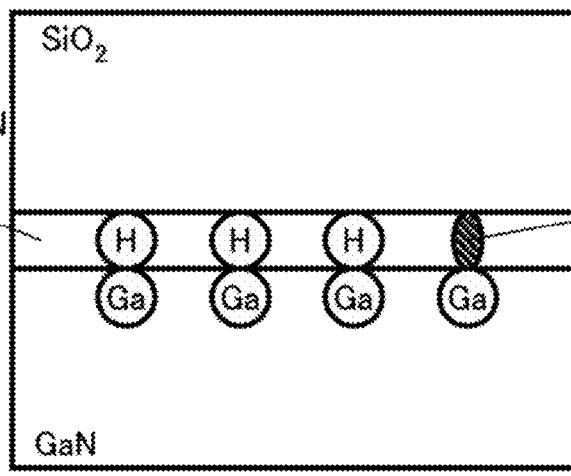
Figure 10C:
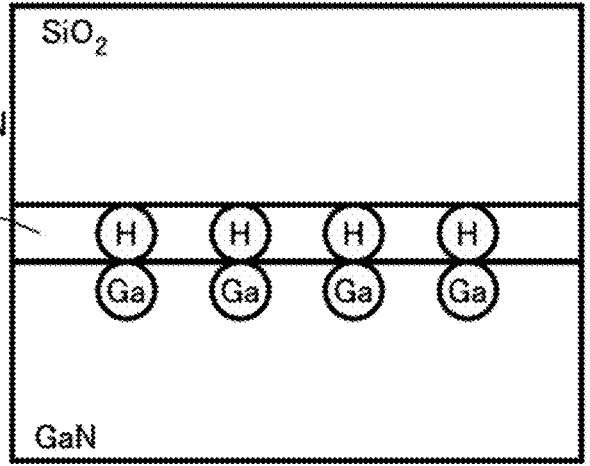

FIGS. 10A to 10C are views for describing a function and an effect of the first embodiment. FIGS. 10A to 10C are schematic cross-sectional views showing an interface region between the nitride semiconductor layer and the insulating layer. FIGS. 10A to 10C illustrate cases in which the insulating layer is silicon oxide ($SiO_2$) and the nitride semiconductor layer is gallium nitride (GaN).

FIG. 10A shows a case in which the interface region does not contain hydrogen. When the interface region does not contain hydrogen, a dangling bond of the gallium atoms exist in the interface region. The surface state is formed by the dangling bond.

FIG. 10B shows a case in which the interface region contains hydrogen. In FIG. 10B, three of four dangling bonds are terminated by hydrogen atoms. For this reason, the surface state is reduced by the dangling bond. Hereinafter, this termination structure will be referred to as a 3H termination.

FIG. 10C shows a case in which the interface region contains hydrogen. In FIG. 10C, four of the four dangling bonds are terminated by hydrogen atoms. For this reason, the surface state is reduced by the dangling bond. Hereinafter, this termination structure will be referred to as a 4H termination.

As a result of a first principle calculation by the inventor, it was found that the 3H termination and the 4H termination can be stably present at the interface between silicon oxide and gallium nitride.

Figure 11A:
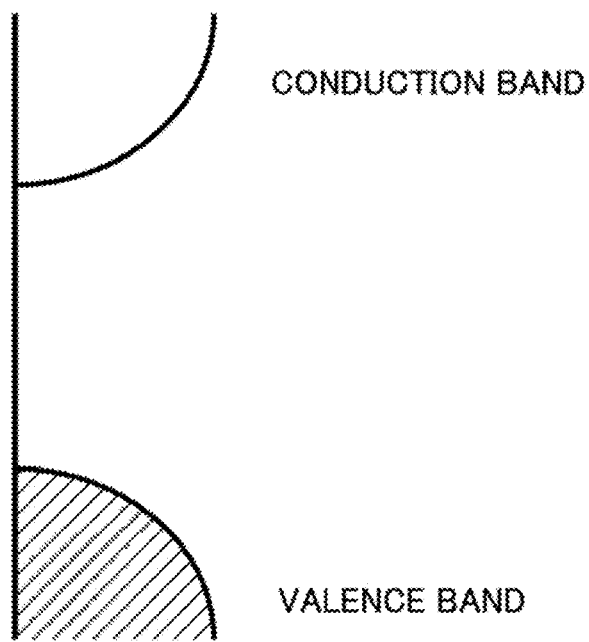
FIGS. 11A and 11B are views for describing the function and the effect of the first embodiment.
Figure 11B:
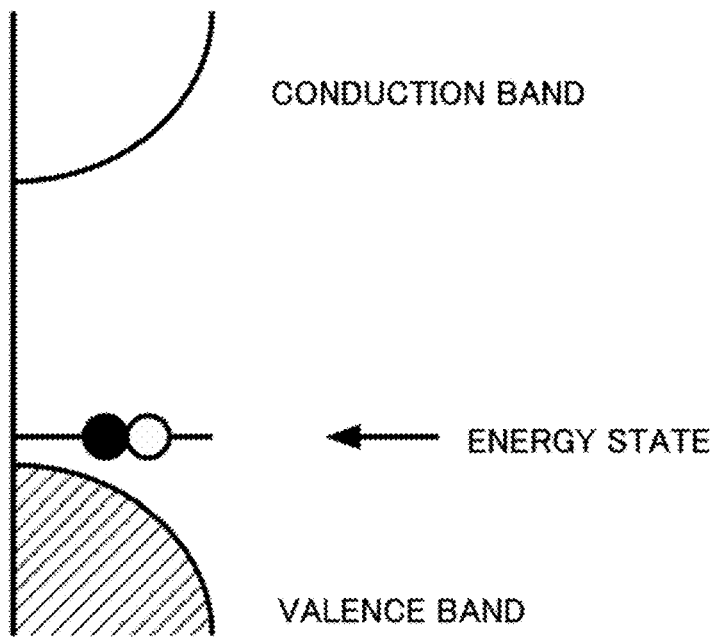

FIGS. 11A and 11B are views for describing a function and an effect of the first embodiment. FIGS. 11A and 11B are views for describing an energy state formed by a hydrogen termination on the surface of gallium nitride. FIGS. 11A and 11B are schematic views of a band structure of gallium nitride. FIG. 11A shows a case of the 3H termination and FIG. 11B shows a case of the 4H termination. FIGS. 11A and 11B are based on a calculation result of the first principle calculation.

As shown in FIG. 11A, in the case of the 3H termination, the energy state is not formed in the band gap. Meanwhile, as shown in FIG. 11B, in the case of the 4H termination, the energy state is formed near the top of a valence band of the gallium nitride.

Further, a black circle in FIG. 11B indicates an energy state filled with an electron, and a white circle indicates an energy state that is not filled with the electron. The energy state formed by the 4H termination is close to the top of the valence band and is thus an acceptor level to receive the electron. The energy state formed by the 4H termination forms a negative fixed charge.

FIG. 12 is a view for describing a function and an effect of the first embodiment. FIG. 12 shows a difference between a formation energy of the 3H termination and a formation energy of the 4H termination. FIG. 12 is based on a result of the first principle calculation.

This is a result obtaining by calculating a difference between the formation energy when the 3H termination and one hydrogen coexist and the formation energy of the 4H termination. In a case in which the formation energy difference is a positive value, the 3H termination is stable, and in a case in which the formation energy difference is a negative value, the 4H termination is stable.

The formation energy difference was calculated for cases in which one hydrogen coexisting with the 3H termination is a state of ion, is in a state of molecule, and exists in interstitial position of lattices of the silicon oxide. For example, the hydrogen exists in the state of ion within hydrogen plasma and the hydrogen exists in a state of molecule within hydrogen gas ($H_2$ gas).

As can be seen from FIG. 12, for example, the 4H termination is stable for hydrogen ion and the 3H termination is stable for hydrogen molecule. Therefore, when hydrogen is supplied to the interface with the hydrogen plasma, the 4H termination is likely to be formed, and when hydrogen is supplied with the hydrogen gas, the 3H termination is likely to be formed.

In the semiconductor device according to the first embodiment, the dangling bonds of the gallium atoms on the surface of the channel layer 14 are terminated with hydrogen atoms in the interface region 25 between the channel layer 14 and the gate insulating layer 16 immediately below the gate electrode 18. Thus, the surface state immediately below the gate electrode 18 is reduced. Thus, a decrease of mobility of the electron and a fluctuation of a threshold voltage is suppressed.

In the semiconductor device according to the first embodiment, the dangling bonds of the gallium atoms or the aluminum atoms on the surface of the barrier layer 15 are terminated with hydrogen atoms in the interface region 25 between the barrier layer 15 between the gate electrode 18 and the drain electrode 22 and the gate insulating layer 16. Thus, the surface state between the gate electrode 18 and the drain electrode 22 is reduced.

When the surface state between the gate electrode 18 and the drain electrode 22 is reduced, a current collapse caused by trapping electrons in the surface state is suppressed. The current collapse is a phenomenon in which an on-resistance of the transistor is increased.

Assuming that the interface region 25 between the gate electrode 18 and the drain electrode 22 is the 4H termination, the negative fixed charge is formed as described above. When the negative fixed charge is present in the interface region 25 between the gate electrode 18 and the drain electrode 22, the 2DEG concentration may decrease and the on-resistance may increase.

In the method for manufacturing the semiconductor device according to the first embodiment, the heat treatment is performed in the atmosphere containing hydrogen gas ($H_2$) when the interface region 25 is formed. As a result, the termination structure becomes the 3H termination and the negative fixed charge is not formed. Thus, the increase in the on-resistance is suppressed.

The dangling bonds of the gallium atoms in the interface region between the nitride semiconductor layer and the insulating layer may also be terminated by fluorine atoms. In the case of the termination by the fluorine atoms, it was found as a result of the first principle calculation by the inventor that a 3F termination terminating three of the four dangling bonds with fluorine atoms, and a 4F termination terminating four of the four dangling bonds with the fluorine atoms are possible.

Figure 13A:
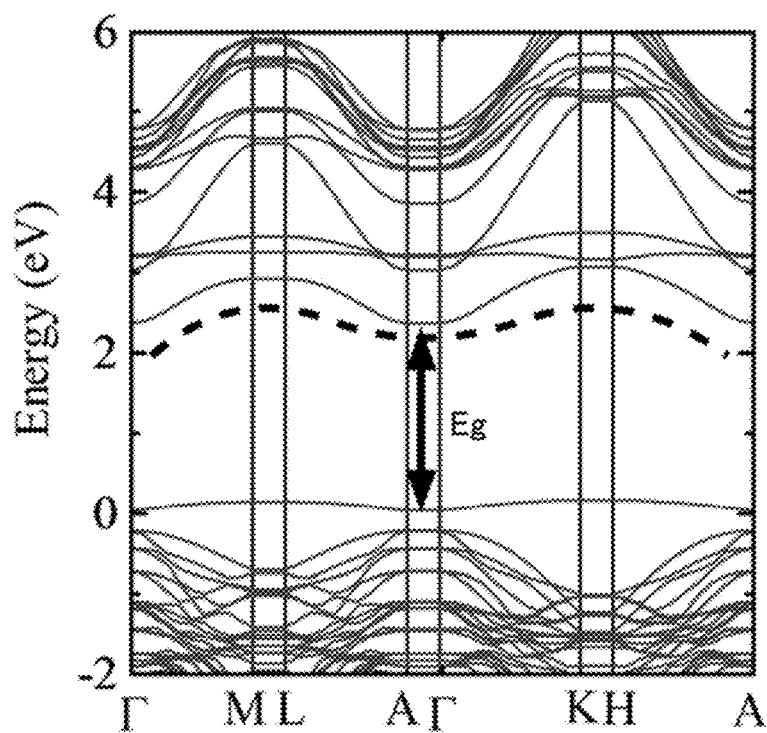
FIGS. 13A and 13B are views for describing the function and the effect of the first embodiment.
Figure 13B:
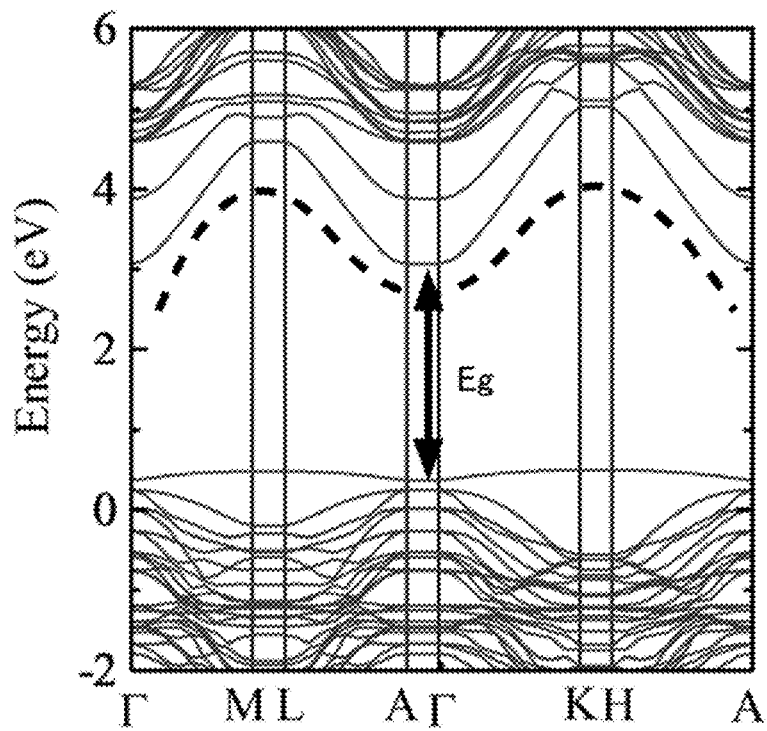

FIGS. 13A and 13B are views for describing a function and an effect of the first embodiment. FIGS. 13A and 13B show the results of the calculation of the band structure of the gallium nitride by the first principle calculation. FIG. 13A shows a case of the 3F termination and FIG. 13B shows a case of the 3H termination.

In the case of the 3H termination, the band gap (Eg) is wider than in the case of the 3F termination. Therefore, in the case of the 3H termination, an electron barrier becomes larger than in the case of the 3F termination. As a result, reliability of the gate insulating layer 16 is improved.

In the case of the 3H termination, the irregularities (dotted lines in FIGS. 13A and 13B) of the energy of the lower end of a conductor are larger than in the case of the 3F termination. Therefore, an effective mass of electrons traveling through a channel of the MOS interface of the HEMT 100 becomes small. As a result, mobility of the electrons at the MOS interface is improved.

As described above, the characteristics of the HEMT 100 are improved by terminating the termination of the dangling bond of the gallium atom in the interface region between the nitride semiconductor layer and the insulating layer with hydrogen atoms instead of fluorine atoms.

Further, when the dangling bond is terminated by deuterium atoms instead of hydrogen atoms, scattering of electrons traveling in the channel of the HEMT 100 is suppressed and the mobility of electron is further improved. This is because thermal vibration of the deuterium atoms having large mass is smaller than hydrogen atoms. Generally, when the electrons are scattered, the heavier a scatterer that scatters the electrons are, the less electrons lose energy. As a result, it is advantageous from the viewpoint of suppressing interface scattering to use terminal elements as heavy as possible.

Figure 14A:
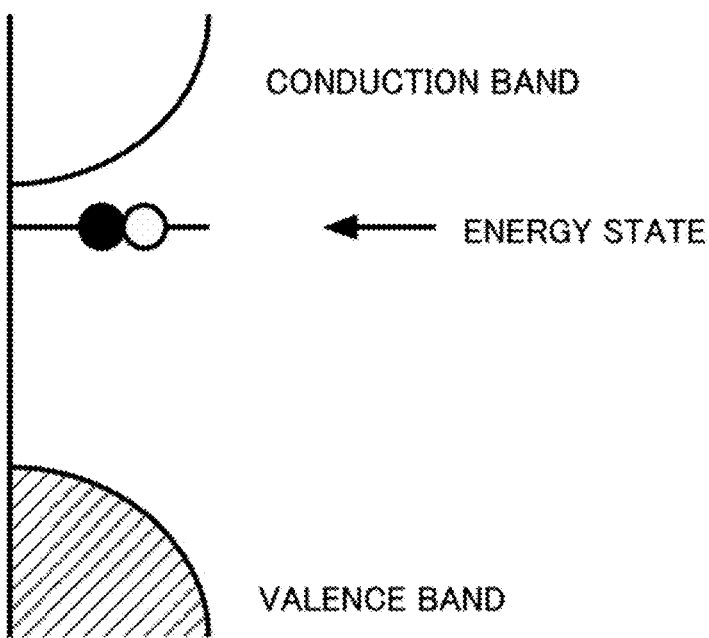
Figure 14B:
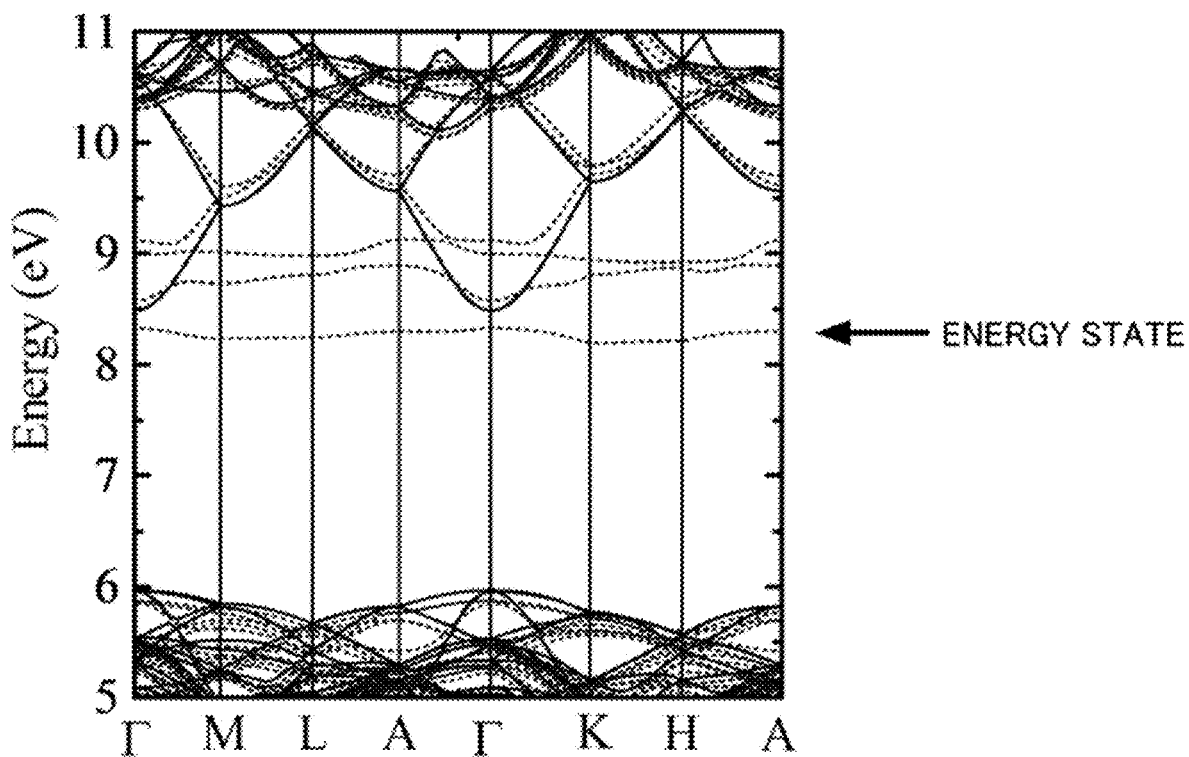

FIGS. 14A and 14B are views for describing a function and an effect of the first embodiment. FIGS. 14A and 14B are views for describing energy states formed by the nitrogen vacancies in the gallium nitride. FIG. 14A shows a schematic view of a band structure of the gallium nitride and FIG. 14B shows a calculation result of the band structure by the first principle calculation.

As shown in FIGS. 14A and 14B, an energy state is formed near a lower end of a conduction band of the gallium nitride by the nitrogen vacancies. Further, a black circle in FIG. 14A indicates an energy state filled with an electron, and a white circle indicates an energy state that is not filled with the electron. The energy state formed by the nitrogen vacancy is near the lower end of the conduction band and thus becomes a donor level that emits electrons.

For example, the nitrogen vacancies (VN) formed by process damage exist in the nitride semiconductor layer. In particular, when the trench is formed by the RIE method, ions accelerated by a high electric field collide with a bottom surface or a side surface of the trench. By the collision of ions, etching damage occurs in the nitride semiconductor layer. By the etching damage, a large amount of nitrogen vacancies are formed in the nitride semiconductor layer around the trench.

Since the nitrogen vacancy becomes the donor level, the nitride semiconductor layer around the trench becomes an n-type semiconductor. Therefore, the threshold voltage of the HEMT decreases.

Figure 15A:
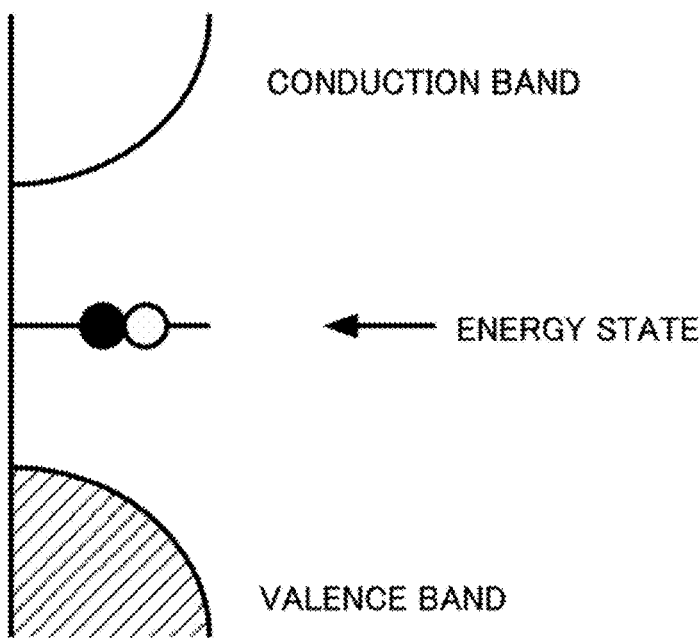
FIGS. 15A and 15B are views for describing the function and the effect of the first embodiment.
Figure 15B:
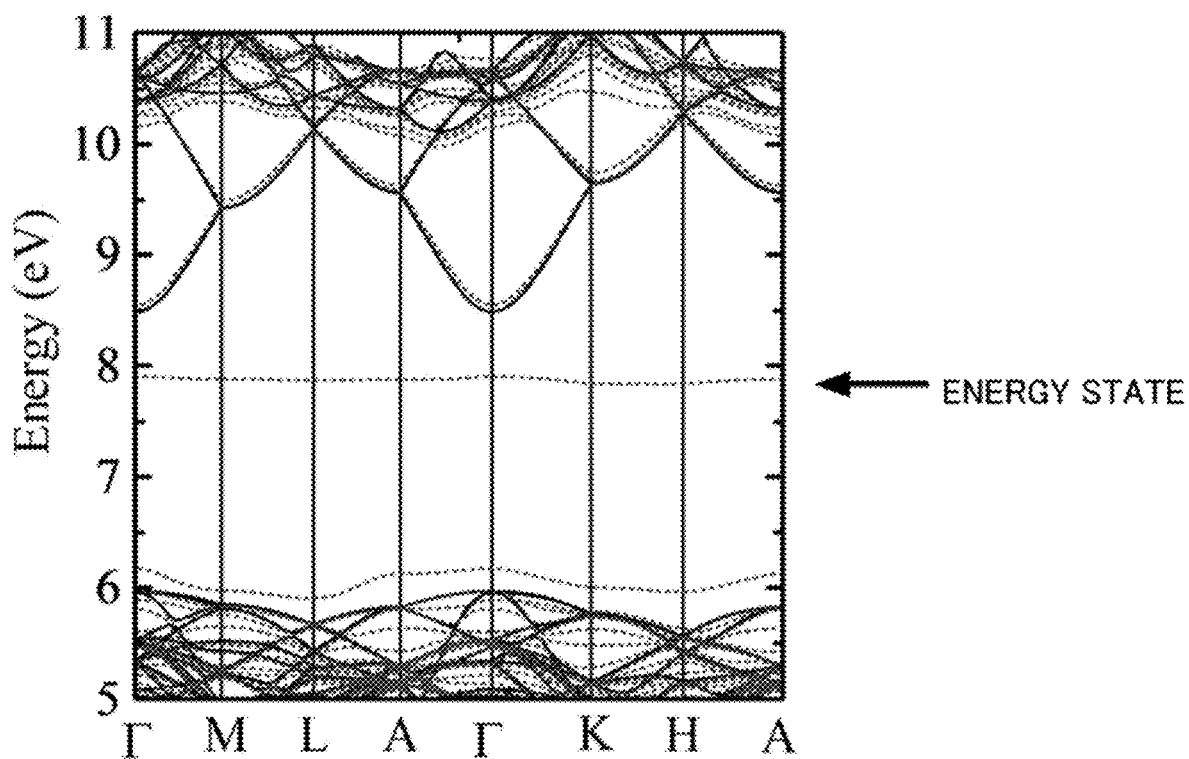

FIGS. 15A and 15B are views for describing a function and an effect of the first embodiment. FIGS. 15A and 15B are views for describing a structure in which four hydrogen atoms (H) are present at the lattice positions of the nitrogen atoms of the gallium nitride. FIG. 15A shows a schematic view of a band structure and FIG. 15B shows a calculation result of the band structure by the first principle calculation.

It is found from the result of the first principle calculation by the inventor that the structure in which nitrogen vacancies are filled with four hydrogen atoms is energy-stable. Hereinafter, this structure will be referred to as a VN-4H structure.

However, as shown in FIGS. 15A and 15B, in the VN-4H structure, an energy state is formed near the middle of a valence band and a conduction band of gallium nitride. Further, a black circle in FIG. 15A indicates an energy state filled with an electron, and a white circle indicates an energy state that is not filled with the electron.

The energy state near the middle of the valence band and the conduction band is not stable in the positive or negative charge. Therefore, when the VN-4H structure is present in the nitride semiconductor layer, the characteristics of the HEMT are not stable. Therefore, the structure of VN-4H is not preferable as a structure for eliminating the nitrogen vacancies.

Figure 16A:
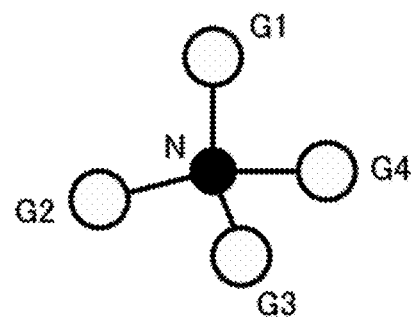
FIGS. 16A to 16C are views for describing the function and the effect of the first embodiment.
Figure 16B:
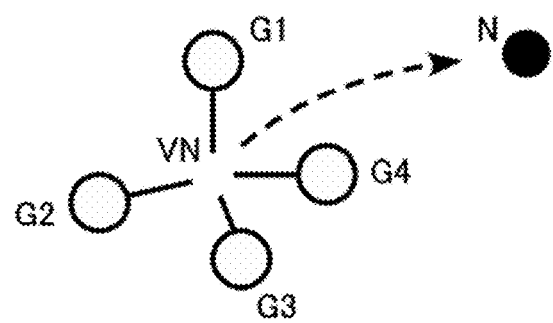
Figure 16C:
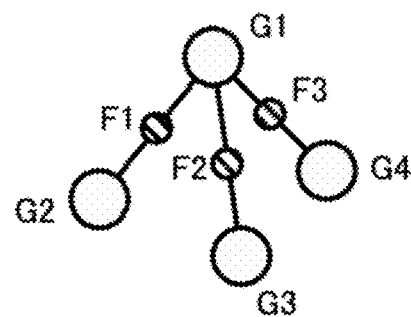

FIGS. 16A to 16C are views for describing a function and an effect of the first embodiment. FIGS. 16A, 16B, and 16C show tetrahedral structures formed by the gallium atoms present in the crystal structure of the gallium nitride. FIG. 16A shows a basic structure, FIG. 16B shows a structure of the nitrogen vacancy, and FIG. 16C shows a structure provided with the fluorine region 50 of the first embodiment.

In the basic structure of FIG. 16A, a nitrogen atom (N) is disposed in the center of a tetrahedral structure formed of a first gallium atom (G1), a second gallium atom (G2), a third gallium atom (G3), and a fourth gallium atom (G4).

FIG. 16B shows a structure in which the nitrogen atom (N) is separated from the center of the tetrahedral structure to form a nitrogen vacancy (VN). Hereinafter, the structure of FIG. 16B will be referred to as a VN structure.

The fluorine region 50 of the first embodiment includes a structure shown in FIG. 16C. That is, the structure shown in FIG. 16C is a structure having three fluorine atoms present at a position of nitrogen atom of a crystal lattice of the gallium nitride. In other words, the structure of FIG. 16C is a structure in which the three fluorine atoms are substituted for the nitrogen atoms present in the crystal structure of the gallium nitride.

More specifically, the structure of FIG. 16C is a structure having a first fluorine atom (F1) bonded to the first gallium atom (G1) and the second gallium atom (G2), a second fluorine atom (F2) bonded to the first gallium atom (G1) and a third gallium atom (G3), and a third fluorine atom (F3) bonded to the first gallium atom (G1) and the fourth gallium atom (G4). Hereinafter, the structure of FIG. 16C will be referred to as a VN-3F structure. It is found by the first principle calculation by the inventor that the VN-3F structure is stable.

In addition, although the VN-3F structure is easily generated from a state in which the VN exists, it is not easy to generate from the basic structure (FIG. 16A) without VN due to a high energy barrier.

Figure 17A:
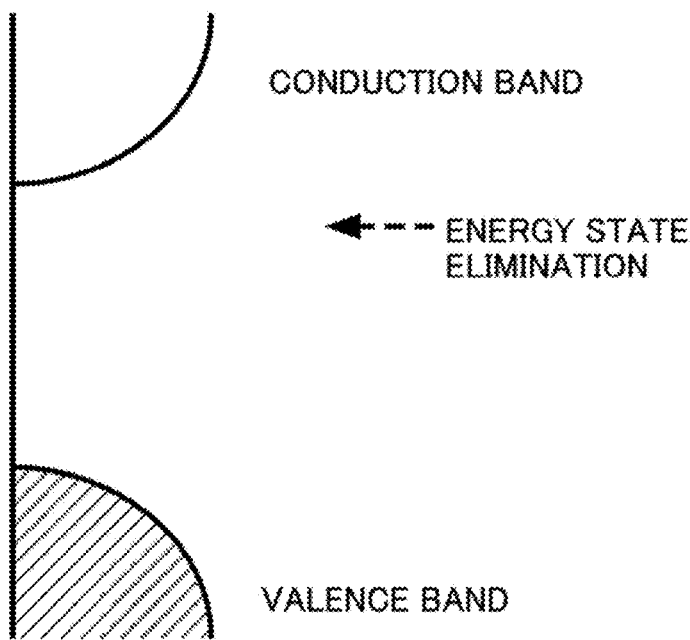
FIGS. 17A and 17B are views for describing the function and the effect of the first embodiment.
Figure 17B:
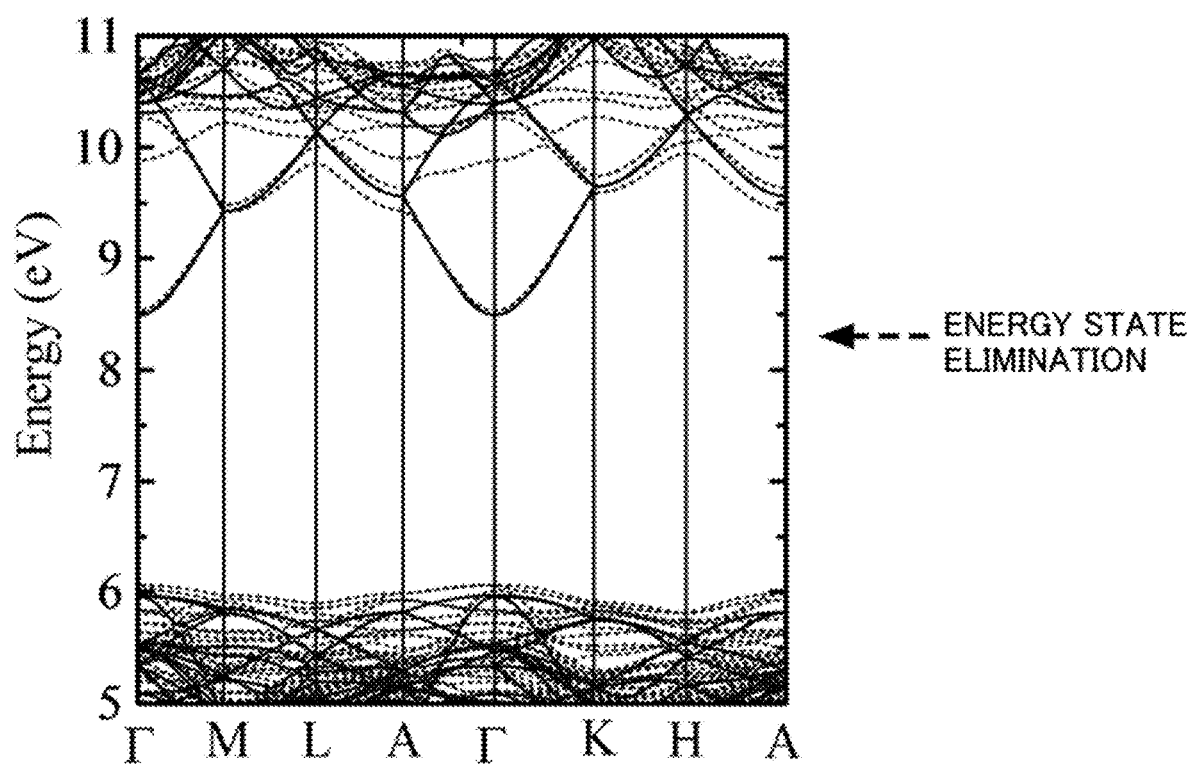

FIGS. 17A and 17B are views for describing a function and an effect of the first embodiment. FIGS. 17A and 17B are views for describing the VN-3F structure. FIG. 17A shows a schematic view of a band structure and FIG. 17B shows a calculation result of the band structure by the first principle calculation.

As shown in FIGS. 17A and 17B, in the VN-3F structure, the donor levels formed by the nitrogen vacancies disappear. In the HEMT 100 according to the first embodiment, the fluorine region 50 is provided in a region where a large amount of nitrogen vacancies existed around the trench 40. Therefore, the donor level due to the nitrogen vacancy decreases. Therefore, the decrease of the threshold voltage of the HEMT 100 is suppressed. As a result, the HEMT 100 having a high threshold voltage is realized.

In the method for manufacturing the semiconductor device according to the first embodiment, after the trench 40 is formed by the RIE method, the first plasma treatment is performed in the atmosphere containing nitrogen trifluoride ($NF_3$). By the first plasma treatment, a large amount of nitrogen vacancies generated by the etching of the trench 40 are filled with three fluorine atoms.

Any of the fluorine and nitrogen atoms constituting the nitrogen trifluoride can fill the nitrogen vacancies. As a result, it is possible to efficiently eliminate the nitrogen vacancies.

In addition, reactivity of the nitrogen trifluoride with the nitride semiconductor is lower than the reactivity of other fluorides such as sulfur hexafluoride ($SF_6$) and carbon tetrafluoride ($CF_4$) with the nitride semiconductor. Therefore, it is suppressed for the etching of the nitride semiconductor from proceeding in the first plasma treatment.

In addition, when other fluorides such as sulfur hexafluoride ($SF_6$) and carbon tetrafluoride ($CF_4$) are used, sulfur (S) or carbon (C) generates a new energy state in the band gap of the nitride semiconductor. Therefore, the characteristics of the HEMT may be deteriorated.

In the $NF_3$ treatment, since there are three Fs near N, VN becomes the VN-3F structure. In order to form a VN-3FF structure in which F is bonded, it is necessary to additionally supply F. At this time, most of Fs are interstitial Fi structures, but a VN-3FF structure is formed by annealing for a long time. The Fi structure is outwardly diffused by heat treatment, but the VN-3FF structure is stable and has a negative charge. By dividing the plasma treatment into a $NF_3$ treatment and a $F_2$ treatment, it is possible to separately use the VN-3F structure and the VN-3FF structure.

For example, when the $CF_4$ treatment or the $SF_6$ treatment is performed, the VN-3FF structure is formed from an initial stage, such that it is not possible to separately use the VN-3F structure (no charge-up) and the VN-3FF structure (a structure in which F is introduced in interstitial position near the VN-3F structure and is negatively charge up). In the case of using $CF_4$ or $SF_6$, there is a demerit that C or S diffuses into the nitride to form a trap and a demerit that it is not possible to separately use the VN-3F structure and the VN-3FF structure.

It is preferable that a fluorine concentration of the fluorine region 50 is $1\times10^{19}$ $cm^{-3}$ or more and $1\times10^{22}$ $cm^{-3}$ or less, and more preferably, $5\times10^{19}$ $cm^{-3}$ or more and $1\times10^{21}$ $cm^{-3}$ or less. Below the above range, the nitrogen vacancies may remain. The range exceeding the above range is difficult to realize under ordinary manufacturing conditions.

In a state in which the VN structure is present, when the interface region 25 is formed by performing the heat treatment in the atmosphere containing hydrogen, the VN-4H structure described above is formed and the characteristics of the HEMT are deteriorated. In the semiconductor device according to the first embodiment, the VN structure is eliminated by forming the VN-3F structure before forming the interface region 25. Therefore, the formation of the VN-4H structure is suppressed. Thus, the deterioration of the characteristics of the HEMT is suppressed.

Hereinabove, according to the semiconductor device and the method for manufacturing the same according to the first embodiment, the dangling bonds on the surface of the nitride semiconductor layer are terminated with the hydrogen atoms. Therefore, the surface state between the nitride semiconductor layer and the insulating layer is reduced. As a result, the HEMT 100 having improved transistor characteristics is realized.

Second Embodiment

A semiconductor device according to a second embodiment differs from the first embodiment in that the first region is not present between the second nitride semiconductor layer between the gate electrode and the second electrode and the gate insulating layer. Hereinafter, some descriptions overlapping with those of the first embodiment are omitted.

Figure 18:
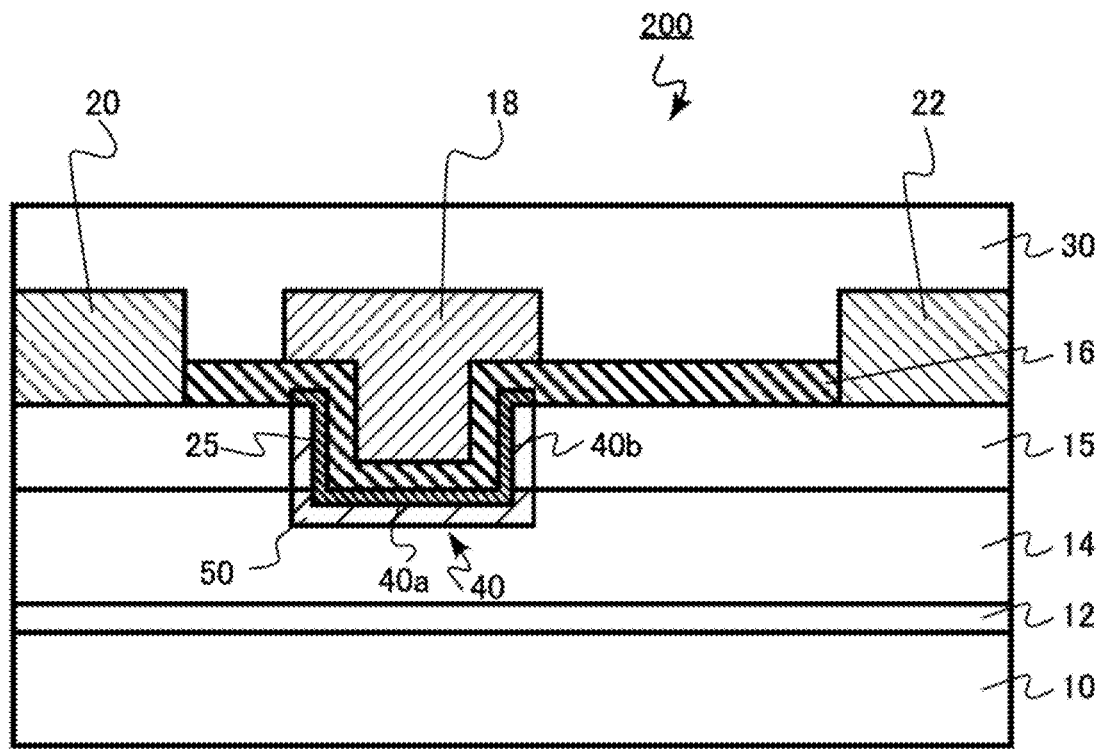
FIG. 18 is a schematic cross-sectional view of a semiconductor device according to a second embodiment.
Figure 19:
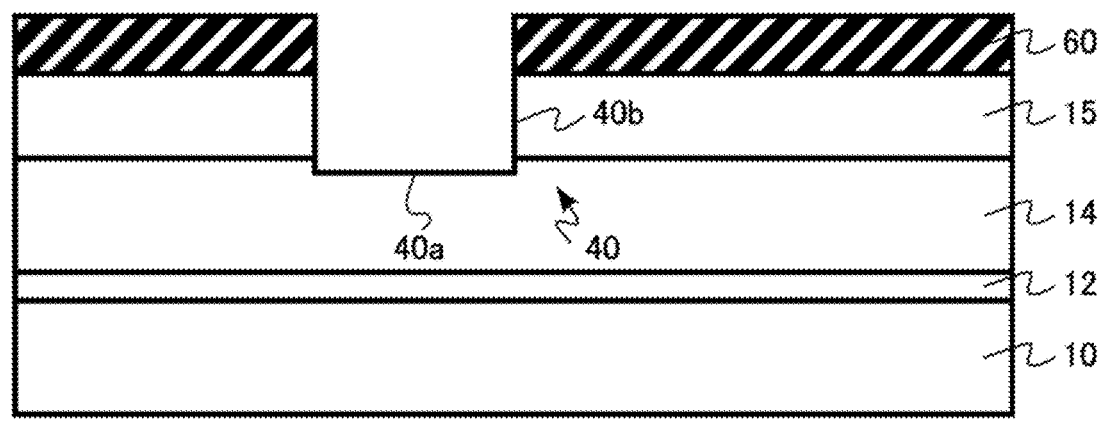
FIG. 19 is a schematic cross-sectional view showing a method for manufacturing a semiconductor device according to a second embodiment.

FIG. 18 is a schematic cross-sectional view of a semiconductor device according to a second embodiment. The semiconductor device is a HEMT 200 of a MIS structure using a GaN-based semiconductor. The HEMT 200 has a gate•recess structure in which a gate electrode is provided in a trench.

The HEMT 200 includes a substrate 10, a buffer layer 12, a channel layer 14 (a nitride semiconductor layer, a first nitride semiconductor layer), a barrier layer 15 (a nitride semiconductor layer, a second nitride semiconductor layer), a gate insulating layer 16 (an insulating layer), a gate electrode 18, a source electrode 20 (a first electrode), a drain electrode 22 (a second electrode), an interface region 25 (a first region), an interlayer insulating layer 30, a trench 40, and a fluorine region 50 (a second region).

The trench 40 has a bottom surface 40a and a side surface 40b. The bottom surface 40a of the trench 40 is disposed in the channel layer 14. The gate insulating layer 16 and the gate electrode 18 are formed in the trench 40. The bottom surface 40a of the trench 40 is disposed in the channel layer 14, such that a two dimensional electron gas below the gate electrode 18 is eliminated. Therefore, a normally-off operation may be realized.

The interface region 25 is provided between the channel layer 14 and the barrier layer 15, and the gate insulating layer 16. The interface region 25 is provided between the bottom surface 40a and the side surface 40b of the trench 40 and the gate insulating layer 16.

The interface region 25 includes hydrogen or deuterium. In the interface region 25, a dangling bond of a gallium atom or an aluminum atom is terminated by a hydrogen atom or a deuterium atom. Hereinafter, the case of termination by a hydrogen atom will be described as an example.

The interface region 25 is a 4H termination. A negative fixed charge is formed in the interface region 25. Further, in the case of the structure (4D termination) terminated with four deuterium atoms D in four dangling bonds, the negative fixed charge is formed similarly to the case of hydrogen atoms.

The fluorine region 50 is disposed in the channel layer 14 and the barrier layer 15 around the trench 40. The fluorine region 50 is adjacent to the bottom surface 40a of the trench 40 in the channel layer 14. The fluorine region 50 is disposed in vicinity of the bottom surface 40a of the trench 40 in the channel layer 14. The fluorine region 50 is in contact with the bottom surface 40a of the trench 40. The fluorine region 50 is adjacent to the side surface 40b of the trench 40 of the barrier layer 15. The fluorine region 50 is disposed in vicinity of the side surface 40b of the trench 40 of the barrier layer 15. The fluorine region 50 is in contact with the side surface 40b of the trench 40.

The fluorine region 50 is adjacent to the interface region 25. The fluorine region 50 is disposed in the vicinity of the interface region 25. The fluorine region 50 is in contact with the interface region 25. The fluorine region 50 is a nitride semiconductor containing fluorine (F).

Next, one example of a method for manufacturing a semiconductor device according to a second embodiment will be described. FIGS. 19 to 24 are schematic cross-sectional views showing a method for manufacturing a semiconductor device according to a second embodiment.

In the method for manufacturing the semiconductor device according to the second embodiment, a trench having a bottom surface and a side surface is formed in the nitride semiconductor layer, and after the trench is formed, a first plasma treatment is performed in an atmosphere containing nitrogen trifluoride, a gate insulating layer is formed in the trench, a second plasma treatment is performed in an atmosphere containing hydrogen, and agate electrode is formed on the gate insulating layer. The method for manufacturing the semiconductor device according to the second embodiment differs from the method for manufacturing the semiconductor device according to the first embodiment in that the second plasma treatment is performed in the atmosphere containing hydrogen.

Here, when H plasma acts on the VN-3F, a VN-3FH structure can be obtained. At this time, a negative charge up occurs. At least a portion of the VN-3F structure may be the VN-3FH structure. At this time, most of Hs are interstitial Hi structures, but a VN-3FH structure is formed by annealing for a long time. The Hi structure is outwardly diffused by heat treatment, but the VN-3FH structure is stable and has a negative charge. By dividing the plasma treatment into a $NF_3$ treatment and a H plasma treatment, it is possible to use the VN-3FH structure.

Similarly to the first embodiment, the trench 40 is formed in the barrier layer 15 and the channel layer 14 (FIG. 19) by using a mask material 60 as a mask.

Figure 20:
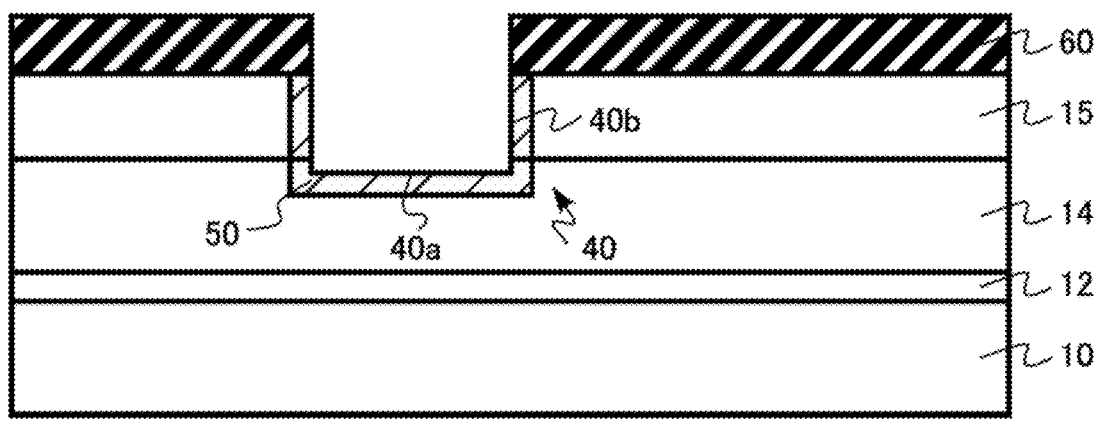
FIG. 20 is a schematic cross-sectional view showing a method for manufacturing a semiconductor device according to a second embodiment.

Next, a first plasma treatment is performed in an atmosphere containing nitrogen trifluoride ($NF_3$) (FIG. 20). A fluorine region 50 is formed by the first plasma treatment. The fluorine region 50 is formed around the trench 40.

Next, the mask material 60 is removed. The removal of the mask material is performed using, for example, wet etching.

Figure 21:
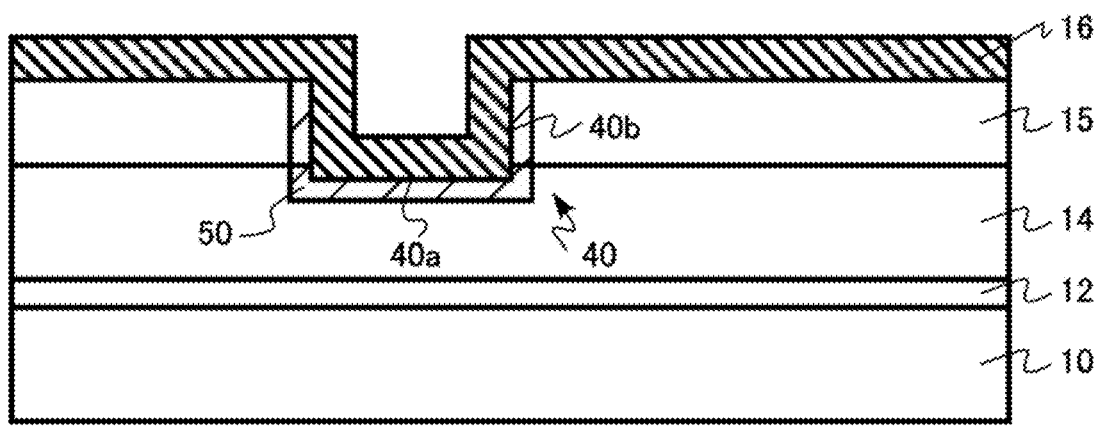
FIG. 21 is a schematic cross-sectional view showing a method for manufacturing a semiconductor device according to a second embodiment.

Next, a gate insulating layer 16 is formed on the channel layer 14 and the barrier layer 15 (FIG. 21). The gate insulating layer 16 is formed of an oxide or an oxynitride. The gate insulating layer 16 is formed of, for example, silicon oxide, aluminum oxide, silicon oxynitride, or aluminum oxynitride. However, in order to prevent nitrogen leakage from the channel layer 14 and the barrier layer 15, it is preferable to insert an amorphous $Si_3N_4$ film having a thickness of 0.5 nm or more and 5 nm or less, or a crystallized AlN film having a thickness of 0.5 nm or more and 5 nm or less into an interface between the channel layer 14 the gate insulating layer 16 and the barrier layer 15 and the gate insulating layer 16. The amorphous $Si_3N_4$ film or the crystallized AlN film having the thickness less than 0.5 nm is difficult to serve as a nitrogen supply source. The amorphous $Si_3N_4$ film or the crystallized AlN film having the thickness of 5 nm or more has a high possibility of trap.

The gate insulating layer 16 is formed by, for example, a chemical vapor deposition (CVD) method.

Next, a heat treatment is performed at 800° C. or more and 1000° C. or less. The gate insulating layer 16 is densified by the heat treatment.

Figure 22:
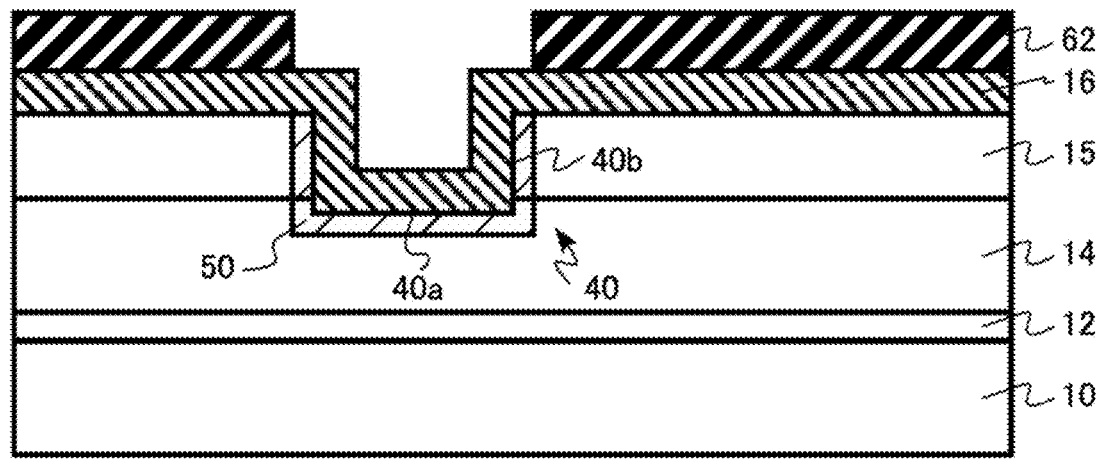
FIG. 22 is a schematic cross-sectional view showing a method for manufacturing a semiconductor device according to a second embodiment.

Next, a mask material 62 is formed on regions other than the trench 40 of the gate insulating layer 16 (FIG. 22). The mask material 62 is, for example, a silicon nitride film.

Figure 23:
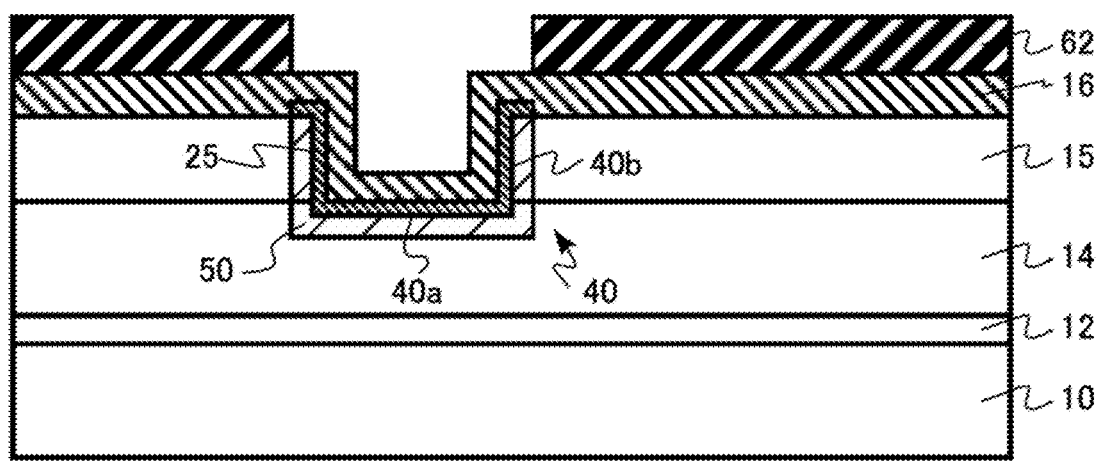
FIG. 23 is a schematic cross-sectional view showing a method for manufacturing a semiconductor device according to a second embodiment.

Next, a second plasma treatment is performed in an atmosphere containing hydrogen (FIG. 23). By the hydrogen plasma, the interface region 25 containing hydrogen is formed in the trench 40.

Figure 24:
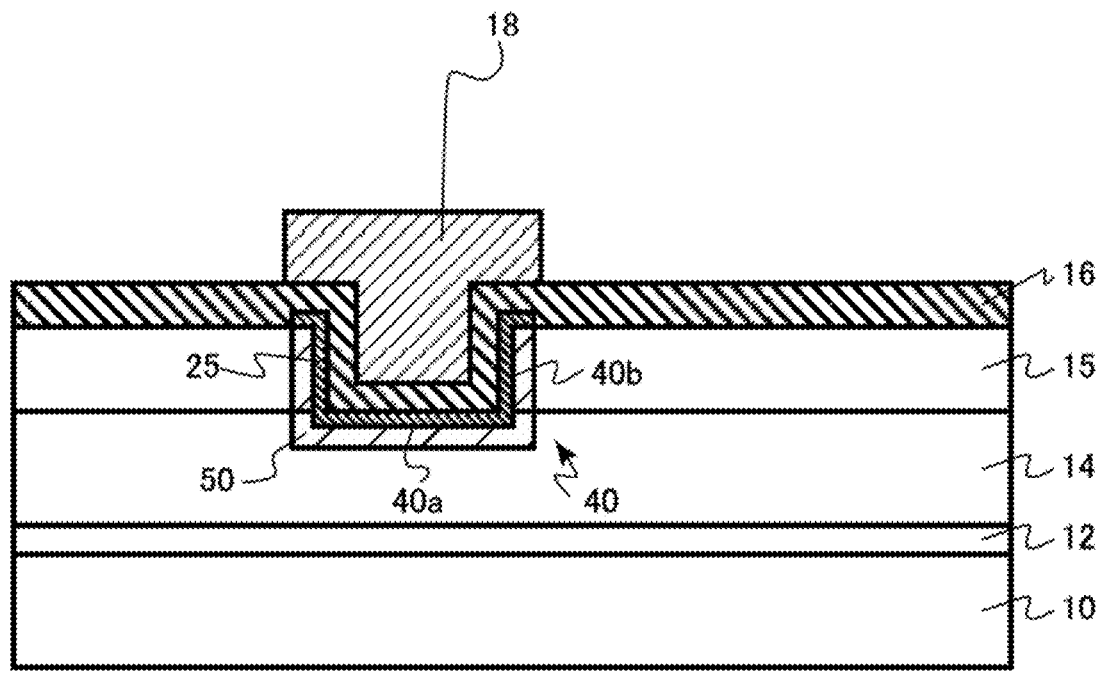
FIG. 24 is a view for describing a function and an effect of the second embodiment.

Next, after the mask material 62 is removed, a gate electrode 18 is formed on the gate insulating layer 16 (FIG. 24). The gate electrode 18 is formed of, for example, polycrystalline silicon containing conductive impurities. In addition, the gate electrode 18 is formed of, for example, a metal. The gate electrode 18 is formed of, for example, titanium nitride (TiN).

The gate electrode 18 is formed by, for example, forming a conductive film by a CVD method or a sputtering method, and patterning by a lithography method and a dry etching method.

Next, a source electrode 20, a drain electrode 22, and an interlayer insulating layer 30 are formed by a known method.

By the manufacturing method described above, the HEMT 200 shown in FIG. 18 is formed.

According to the semiconductor device and the method for manufacturing the same according the second embodiment, the interface region 25 has a negative fixed charge. Therefore, a threshold voltage of the HEMT 200 increases.

Hereinabove, according to the semiconductor device and the method for manufacturing the same according to the second embodiment, the dangling bonds on the surface of the nitride semiconductor layer are terminated with the hydrogen atoms. Therefore, the surface state between the nitride semiconductor layer and the insulating layer is reduced. In addition, the threshold voltage increases. As a result, the HEMT 200 having improved transistor characteristics is realized.

Third Embodiment

A semiconductor device according to a third embodiment includes a nitride semiconductor layer, a silicon oxide layer, and a first region disposed between the nitride semiconductor layer and the silicon oxide layer and including at least one element of hydrogen and deuterium, wherein in a concentration distribution of at least one element in the silicon oxide layer, the first region, and the nitride semiconductor layer, a distance between a first position at which a concentration of at least one element has the maximum value and a second position present on the side of the nitride semiconductor layer with respect to the first position and having the concentration of at least one element which is two orders of magnitude lower than the maximum value is 1 nm or less. The semiconductor device according to the third embodiment differs from the first embodiment in that it does not include the second region. Hereinafter, some descriptions overlapping with those of the first embodiment are omitted.

Figure 25:
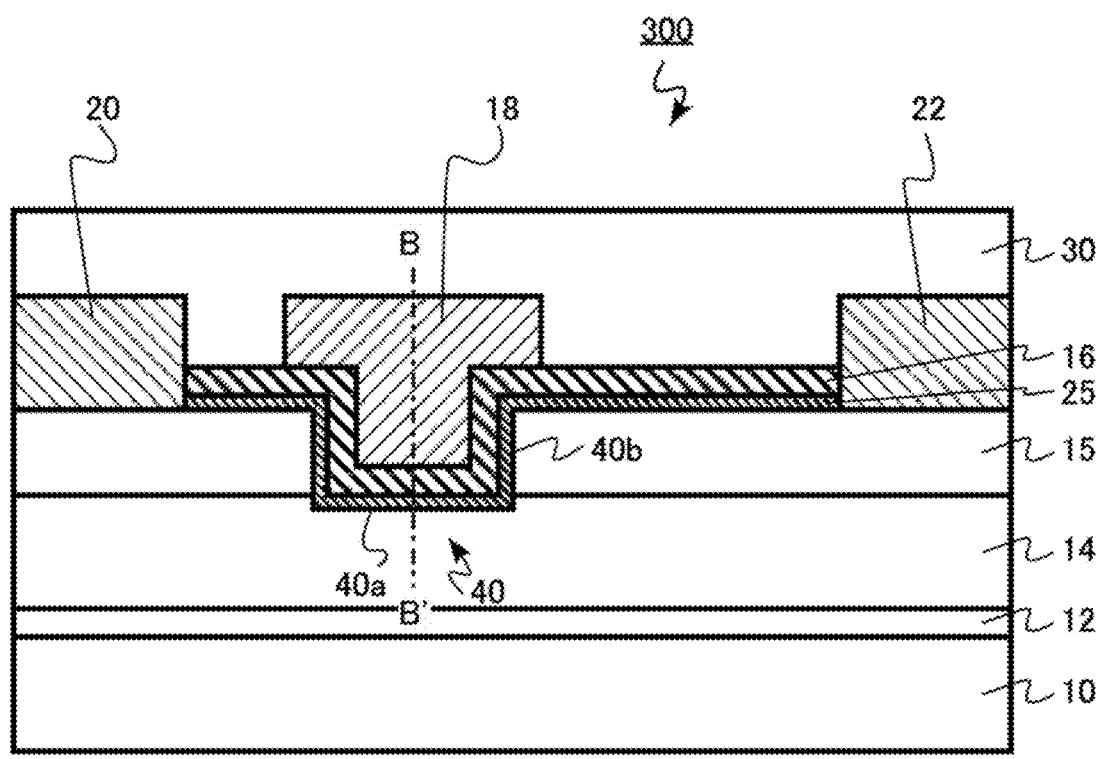
FIG. 25 is a schematic cross-sectional view of a semiconductor device according to a third embodiment.

FIG. 25 is a schematic cross-sectional view of a semiconductor device according to a third embodiment. The semiconductor device is a HEMT 300 of a MIS structure using a GaN-based semiconductor. The HEMT 300 has a gate•recess structure in which a gate electrode is provided in a trench.

The HEMT 300 includes a substrate 10, a buffer layer 12, a channel layer 14 (a nitride semiconductor layer, a first nitride semiconductor layer), a barrier layer 15 (a nitride semiconductor layer, a second nitride semiconductor layer), a gate insulating layer 16 (a silicon oxide layer), a gate electrode 18, a source electrode 20 (a first electrode), a drain electrode 22 (a second electrode), an interface region 25 (a first region), an interlayer insulating layer 30, and a trench 40.

The trench 40 has a bottom surface 40a and aside surface 40b. The bottom surface 40a of the trench 40 is disposed in the channel layer 14. The gate insulating layer 16 and the gate electrode 18 are formed in the trench 40. The bottom surface 40a of the trench 40 is disposed in the channel layer 14, such that a two dimensional electron gas below the gate electrode 18 is eliminated. Therefore, a normally-off operation may be realized.

The gate insulating layer 16 is formed of, for example, silicon oxide.

The interface region 25 is provided between the channel layer 14 and the barrier layer 15, and the gate insulating layer 16. The interface region 25 is provided between the bottom surface 40a and the side surface 40b of the trench 40 and the gate insulating layer 16. The interface region 25 is provided between the barrier layer 15 between the gate electrode 18 and the drain electrode 22 and the gate insulating layer 16. In addition, the interface region 25 is provided between the barrier layer 15 between the gate electrode 18 and the source electrode 20 and the gate insulating layer 16.

The interface region 25 includes hydrogen or deuterium. In the interface region 25, a dangling bond of a gallium atom or an aluminum atom is terminated by a hydrogen atom or a deuterium atom. Hereinafter, the case of termination by a hydrogen atom will be described as an example.

Figure 26:
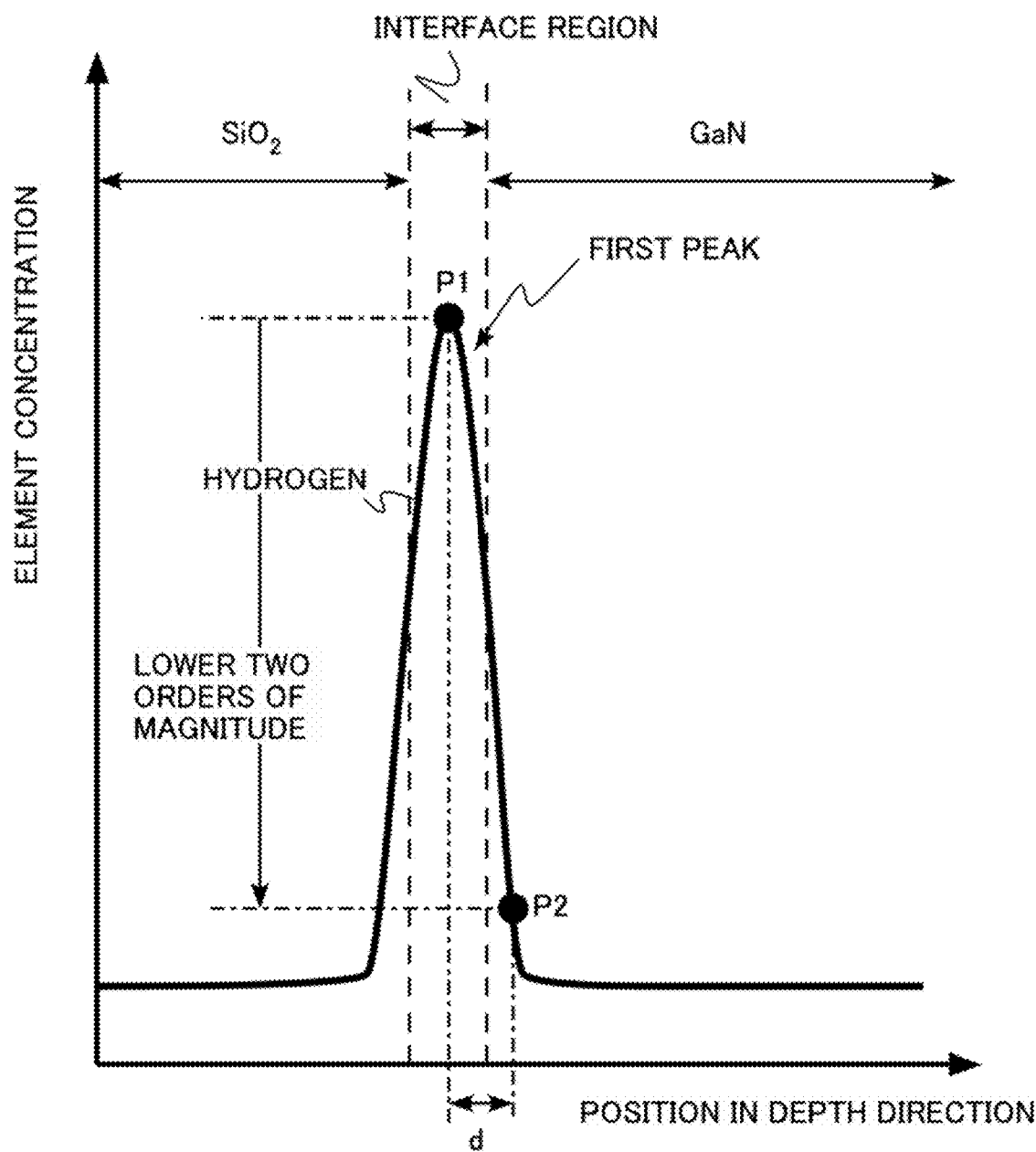
FIG. 26 is a graph showing concentration distributions of elements of the semiconductor device according to the third embodiment.

FIG. 26 is a graph showing concentration distributions of elements of the semiconductor device according to the third embodiment. FIG. 26 shows concentration distributions of elements in the gate insulating layer 16, the interface region 25, and the nitride semiconductor layer. FIG. 26 shows a concentration distribution of hydrogen (H) in a depth direction along a line B-B' of FIG. 25. FIG. 26 illustrates a case in which the gate insulating layer 16 is silicon oxide ($SiO_2$) and the nitride semiconductor layer is gallium nitride (GaN).

A first peak of a hydrogen concentration distribution is within the interface region 25. A full width at half maximum of the first peak is, for example, 2 nm or less. The hydrogen concentration in the interface region 25 is $1 \times 10^{19}$ cm$^{-3}$ or more and $1 \times 10^{22}$ cm$^{-3}$ or less.

In addition, a distance ("d" in FIG. 26) between a first position P1 at which the hydrogen concentration has the maximum value and a second position P2 present on the side of the nitride semiconductor layer with respect to the first position P1 and having the hydrogen concentration which is two orders of magnitude lower than the maximum value is 1 nm or less.

When the HEMT 300 is manufactured, it is preferable that the VN structure in the nitride semiconductor layer formed by process damage is reduced by the heat treatment in an atmosphere containing nitrogen.

If there is a large amount of VN structure in the nitride semiconductor layer, the interface is oxidized in the step of forming the gate insulating film $SiO_2$, and a $Ga_2O_3$ layer (a structure in which three oxygen atoms are bonded to Ga) is formed. After the VN structure is sufficiently reduced, the hydrogen termination needs to be performed. As the VN structure is reduced, oxidation resistance is improved and as a result, a GaON layer (a structure in which three nitrogen atoms and one oxygen atom are bond to Ga) is formed instead of a $Ga_2O_3$ layer. At this time, the amount of oxygen/(amount of oxygen+amount of nitrogen) is 0.15<amount of oxygen/(amount of oxygen+amount of nitrogen)≤0.35. More preferably, the amount of oxygen/(amount of oxygen+amount of nitrogen) is 0.2<(amount of oxygen)/(amount of oxygen+amount of nitrogen)<0.3.

One method (VN removal process) of sufficiently reducing the VN structure is to perform a low temperature (preferably room temperature) nitrogen plasma treatment for the surface of the nitride semiconductor layer. A typical amount of oxygen/(oxygen amount+nitrogen amount) of GaON is 0.25 when the VN removal process is performed for a long time. The reason is that 0.25, which is the most stable in terms of energy. This can be seen by etching the gate insulating film ($SiO_2$) and analyzing the surface of the gate insulating film with XPS.

$SiO_2$ is deposited at a low temperature by CVD or the like. Next, when a $H_2$ treatment is performed a 3H termination structure is obtained. In addition, when the plasma hydrogen treatment is performed, a 4H termination is obtained. Since the 4H termination is charged up negatively, the threshold may increase.

Hereinabove, according to the semiconductor device according to the third embodiment, the dangling bonds on the surface of the nitride semiconductor layer are terminated with the hydrogen atoms, similarly to the first embodiment. Therefore, the surface state between the nitride semiconductor layer and the insulating layer is reduced. As a result, the HEMT 300 having improved transistor characteristics is realized.

Fourth Embodiment

A semiconductor device according to a fourth embodiment differs from the first embodiment in that the bottom surface is disposed in the second nitride semiconductor layer. Hereinafter, some descriptions overlapping with those of the first embodiment are omitted.

Figure 27:
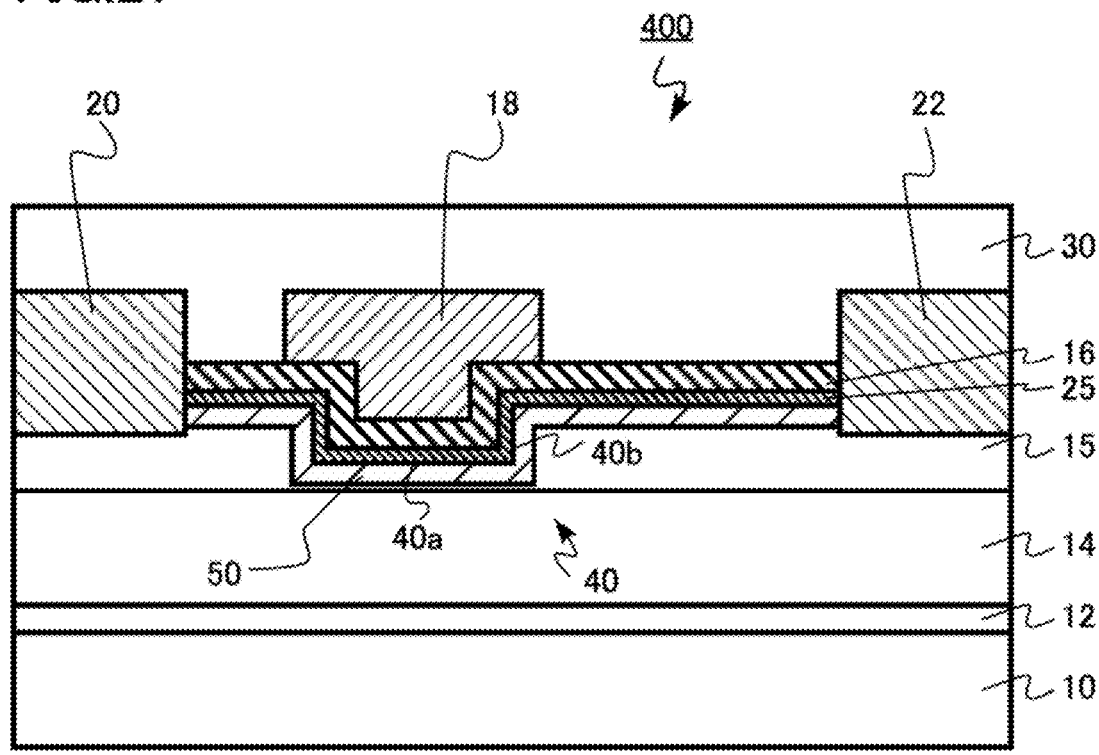
FIG. 27 is a schematic cross-sectional view of a semiconductor device according to a fourth embodiment.

FIG. 27 is a schematic cross-sectional view of a semiconductor device according to a fourth embodiment. The semiconductor device is a HEMT 400 of a MIS structure using a GaN-based semiconductor. The HEMT 400 has a gate•recess structure in which a gate electrode is provided in a trench.

The HEMT 400 includes a substrate 10, a buffer layer 12, a channel layer 14 (a nitride semiconductor layer, a first nitride semiconductor layer), a barrier layer 15 (a nitride semiconductor layer, a second nitride semiconductor layer), a gate insulating layer 16 (an insulating layer), agate electrode 18, a source electrode 20 (a first electrode), a drain electrode 22 (a second electrode), an interface region 25 (a first region), an interlayer insulating layer 30, a trench 40, and a fluorine region 50 (a second region).

The trench 40 has a bottom surface 40a and a side surface 40b. The bottom surface 40a of the trench 40 is disposed in the barrier layer 15. The gate insulating layer 16 and the gate electrode 18 are formed in the trench 40. A thickness of the barrier layer 15 immediately below the bottom surface 40a of the trench 40 is decreased, such that density of a two dimensional electron gas below the gate electrode 18 is reduced. Therefore, a normally-off operation may be realized.

According to the semiconductor device according to the fourth embodiment, the dangling bonds on the surface of the nitride semiconductor layer are terminated with the hydrogen atoms, similarly to the first embodiment. Therefore, the surface state between the nitride semiconductor layer and the insulating layer is reduced. As a result, the HEMT 400 having improved transistor characteristics is realized.

Fifth Embodiment

A power circuit and a computer according to a fifth embodiment have the HEMT according to the first to fourth embodiments.

Figure 28:
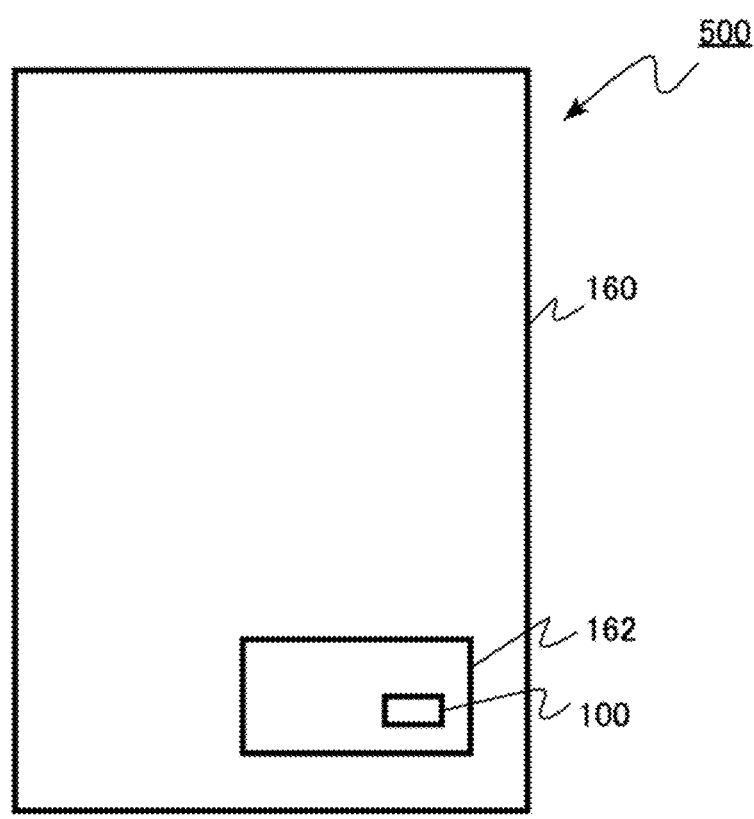
FIG. 28 is a schematic view of a computer according to a fifth embodiment.

FIG. 28 is a schematic view of a computer according to a fifth embodiment. The computer according to the fifth embodiment is, for example, a server 500.

The server 500 has a power circuit 162 within a housing 160. The server 500 is a computer activating server software. The power circuit 162 has, for example, the HEMT 100 according to the first embodiment.

The power circuit 162 realizes a stable operation by having the HEMT 100 having improved transistor characteristics. In addition, the server 500 realizes a stable operation by having the power circuit 162.

According to the fifth embodiment, it is possible to realize the power circuit and the computer in which the stable operation is realized.

In the first to fourth embodiments, although the gallium nitride or the aluminum gallium nitride containing the gallium (Ga) is described as the nitride semiconductor as an example, for example, indium gallium nitride and indium aluminum gallium nitride containing indium (In) may also be used. Aluminum nitride, indium nitride, and indium aluminum nitride that do not contain Ga may also be used. In addition, a stacked structure thereof may also be used.

In addition, in the first to fourth embodiments, although the undoped aluminum gallium nitride is described as the barrier layer 15 as an example, an n-type aluminum gallium nitride may also be used.

In addition, in the first to fourth embodiments, although the HEMT having the gate•recess structure is described as an example, the present disclosure may also be applied to a HEMT of a planar gate structure that does not include the gate•recess structure.

In addition, a structure in which the aluminum gallium nitride or aluminum nitride is again grown on the bottom of the trench may also be used.

In addition, in the first to fourth embodiments, although the HEMT using the two dimensional electron gas as the carrier is described as an example, the present disclosure may also be applied to a typical MOSFET (Metal Oxide Semiconductor Field Effect Transistor) that does not use the two dimensional electron gas.

In addition, in the first to fourth embodiments, although the case in which the insulating layer is the gate insulating layer is described as an example, the insulating layer is not necessarily limited to the gate insulating layer.

In addition, the insulating film may include, for example, a nitride. For example, the nitride is silicon nitride or aluminum nitride. In addition, the insulating film may be a stacked film in which a portion of the insulating film contacting the channel layer 14 and a portion of the insulating film contacting the barrier layer 15 are different from each other.

While certain embodiments have been described, these embodiments have been presented by way of example only, and are not intended to limit the scope of the inventions. Indeed, the semiconductor device, the method for manufacturing the same, the power circuit, and the computer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a nitride semiconductor layer;
    an insulating layer;
    a first region disposed between the nitride semiconductor layer and the insulating layer and containing at least one element of hydrogen and deuterium; and
    a second region disposed in the nitride semiconductor layer, the first region interposed between the insulating layer and the second region, the second region containing fluorine, and at least a first portion of the first region directly contacting a second portion of the second region,
    wherein a concentration of the at least one element in the insulating layer is maximum at an end facing the nitride semiconductor.

2. The semiconductor device according to claim 1, wherein in a first concentration distribution of the at least one element in the insulating layer, the first region, and the nitride semiconductor layer, a first peak is within the first region, and
    in a second concentration distribution of the fluorine in the insulating layer, the first region, and the nitride semiconductor layer, a second peak is within the second region.

3. The semiconductor device according to claim 2, wherein a first full width at a first half maximum of the first peak is 2 nm or less, and a second full width at a second half maximum of the second peak is 10 nm or less.

4. The semiconductor device according to claim 1, wherein a first concentration of the at least one element in the first region is $1 \times 10^{19}$ cm$^{-3}$ or more and $1 \times 10^{22}$ cm$^{-3}$ or less, and
    a second concentration of the fluorine in the second region is $1 \times 10^{19}$ cm$^{-3}$ or more and $1 \times 10^{22}$ cm$^{-3}$ or less.

5. The semiconductor device according to claim 1, wherein in a concentration distribution of the at least one element in the insulating layer, the first region, and the nitride semiconductor layer, a distance between a first position at which a concentration of the at least one element has a maximum value and a second position present on a side of the nitride semiconductor layer with respect to the first position and having the concentration of the at least one element which is two orders of magnitude lower than the maximum value is 1 nm or less.

6. The semiconductor device according to claim 1, wherein the second region has three fluorine atoms present at a position of nitrogen atom of a crystal lattice of the nitride semiconductor layer.

7. The semiconductor device according to claim 1, wherein the second region has a first fluorine atom bonded to a first gallium atom and a second gallium atom, a second fluorine atom bonded to the first gallium atom and a third gallium atom, and a third fluorine atom bonded to the first gallium atom and a fourth gallium atom.

8. The semiconductor device according to claim 1, further comprising a gate electrode disposed on the insulating layer.

9. The semiconductor device according to claim 1, wherein a nitride semiconductor layer includes at least one of gallium (Ga) and aluminum (Al), and the at least one element in the first region is bonded to the at least one of gallium (Ga) and aluminum (Al).

10. A semiconductor device comprising:
    a first nitride semiconductor layer;

a second nitride semiconductor layer disposed on the first nitride semiconductor layer, the first nitride semiconductor layer having a first band gap less than a second band gap of the second nitride semiconductor layer, the second nitride semiconductor layer;

a first electrode disposed on or above the first nitride semiconductor layer and electrically connected to the first nitride semiconductor layer;

a second electrode disposed on or above the first nitride semiconductor layer and electrically connected to the first nitride semiconductor layer;

a trench disposed between the first electrode and the second electrode and having a bottom surface and a side surface, the bottom surface being disposed in any one of the first nitride semiconductor layer and the second nitride semiconductor layer;

a gate electrode disposed in the trench;

a gate insulating layer disposed between the bottom surface and the gate electrode and between the side surface and the gate electrode;

a first region disposed between the bottom surface and the gate insulating layer and containing at least one element of hydrogen and deuterium; and a second region disposed in at least one of the first nitride semiconductor layer and the second nitride semiconductor layer, the first region interposed between the gate insulating layer and the second region, the second region containing fluorine, and at least a first portion of the first region directly contacting a second portion of the second region, wherein a concentration of the at least one element in the gate insulating layer is maximum at an end facing the nitride semiconductor.

11. The semiconductor device according to claim 10, wherein the first region is disposed between the side surface and the gate insulating layer.

12. The semiconductor device according to claim 10, wherein the gate insulating layer is disposed on the second nitride semiconductor layer between the gate electrode and the second electrode, and
the first region is disposed between the second nitride semiconductor layer between the gate electrode and the second electrode and the gate insulating layer.

13. The semiconductor device according to claim 10, wherein the first nitride semiconductor layer is gallium nitride, and
the second nitride semiconductor layer is aluminum gallium nitride.

14. A power circuit comprising the semiconductor device according to claim 10.

15. A computer comprising the semiconductor device according to claim 10.

16. The semiconductor device according to claim 10, wherein a first nitride semiconductor layer includes at least one of gallium (Ga) and aluminum (Al), the second nitride semiconductor layer includes at least one of gallium (Ga) and aluminum (Al), and the at least one element in the first region is bonded to the at least one of gallium (Ga) and aluminum (Al) included in the first nitride semiconductor layer or the second nitride semiconductor layer.

17. A semiconductor device comprising:
a nitride semiconductor layer;
an insulating layer;
a first region disposed between the nitride semiconductor layer and the insulating layer and containing at least one element of hydrogen and deuterium; and a second region disposed in the nitride semiconductor layer, the first region interposed between the insulating layer and the second region, the second region containing fluorine, and at least a first portion of the first region directly contacting a second portion of the second region, wherein in a first concentration distribution of the at least one element in the insulating layer, the first region, and the nitride semiconductor layer, a first peak is within the first region, and a distance between the first peak and the nitride semiconductor layer is 1 nm or less.

18. The semiconductor device according to claim 17, wherein a nitride semiconductor layer includes at least one of gallium (Ga) and aluminum (Al), and the at least one element in the first region is bonded to the at least one of gallium (Ga) and aluminum (Al).

19. A semiconductor device comprising:
a first nitride semiconductor layer;
a second nitride semiconductor layer disposed on the first nitride semiconductor layer, the first nitride semiconductor layer having a first band gap less than a second band gap of the second nitride semiconductor layer, the second nitride semiconductor layer;

a first electrode disposed on or above the first nitride semiconductor layer and electrically connected to the first nitride semiconductor layer;

a second electrode disposed on or above the first nitride semiconductor layer and electrically connected to the first nitride semiconductor layer;

a trench disposed between the first electrode and the second electrode and having a bottom surface and a side surface, the bottom surface being disposed in any one of the first nitride semiconductor layer and the second nitride semiconductor layer;

a gate electrode disposed in the trench;

a gate insulating layer disposed between the bottom surface and the gate electrode and between the side surface and the gate electrode;

a first region disposed between the bottom surface and the gate insulating layer and containing at least one element of hydrogen and deuterium; and a second region disposed in at least one of the first nitride semiconductor layer and the second nitride semiconductor layer, the first region interposed between the gate insulating layer and the second region, the second region containing fluorine, and at least a first portion of the first region directly contacting a second portion of the second region, wherein in a first concentration distribution of the at least one element in the gate insulating layer, the first region, and the nitride semiconductor layer, a first peak is within the first region, and a distance between the first peak and the nitride semiconductor layer is 1 nm or less.

20. The semiconductor device according to claim 19, wherein a first nitride semiconductor layer includes at least one of gallium (Ga) and aluminum (Al), the second nitride semiconductor layer includes at least one of gallium (Ga) and aluminum (Al), and the at least one element in the first region is bonded to the at least one of gallium (Ga) and aluminum (Al) included in the first nitride semiconductor layer or the second nitride semiconductor layer.

* * * * *